US009929488B2

(12) United States Patent
Ozawa

(10) Patent No.: US 9,929,488 B2
(45) Date of Patent: Mar. 27, 2018

(54) CONNECTOR MODULE AND HYDRAULIC PRESSURE CONTROL DEVICE

(71) Applicant: Yazaki Corporation, Tokyo (JP)

(72) Inventor: Keisuke Ozawa, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/453,025

(22) Filed: Mar. 8, 2017

(65) Prior Publication Data

US 2017/0264039 A1 Sep. 14, 2017

(30) Foreign Application Priority Data

Mar. 9, 2016 (JP) .................................. 2016-045699

(51) Int. Cl.
| | |
|---|---|
| H01R 12/00 | (2006.01) |
| H05K 1/00 | (2006.01) |
| H01R 13/00 | (2006.01) |
| F16K 31/06 | (2006.01) |
| H01R 13/40 | (2006.01) |
| H01R 13/514 | (2006.01) |

(52) U.S. Cl.
CPC ....... *H01R 13/005* (2013.01); *F16K 31/0675* (2013.01); *H01R 13/40* (2013.01); *H01R 13/514* (2013.01)

(58) Field of Classification Search
CPC ...... H01R 9/226; H01R 11/00; H01R 25/003; H01R 13/005; H01R 13/514; H01R 12/526; H01R 12/585; H01R 12/707; B60T 8/3672; B60T 8/3675; F16K 31/0675

USPC ....................... 439/165, 76.2, 502; 174/72 A
See application file for complete search history.

(56) References Cited

U.S. PATENT DOCUMENTS

| | | | |
|---|---|---|---|
| 5,895,027 A | 4/1999 | Yagi | |
| 6,155,874 A | 12/2000 | Endo et al. | |
| 6,407,337 B1 * | 6/2002 | Ogawa | ............... B60R 16/0215 |
| | | | 174/154 |
| 6,582,239 B2 * | 6/2003 | Ozawa | ............... B60R 16/0238 |
| | | | 439/76.2 |
| 7,521,634 B2 * | 4/2009 | Clem | ................. G01R 1/06788 |
| | | | 174/113 R |

(Continued)

FOREIGN PATENT DOCUMENTS

| | | |
|---|---|---|
| JP | 08-051019 A | 2/1996 |
| JP | 09-306558 A | 11/1997 |
| JP | 11-008023 A | 1/1999 |

(Continued)

*Primary Examiner* — Hae Moon Hyeon
(74) *Attorney, Agent, or Firm* — Sughrue Mion, PLLC

(57) ABSTRACT

A connector module includes an electrical connection structure including: a plurality of electrical wires; and a wiring plate on which the electrical wires are wired. Each of the electrical wires is coated with an insulating coating, and includes: a wiring portion wired on the wiring plate; and an electrical connection portion to be physically and electrically connected to a counterpart electrical connection portion. The wiring plate includes a surrounded recess-shaped portion. The electrical connection portion and the counterpart electrical connection portion are arranged in the recess-shaped portion and are formed such that a physical and electrical connection part thereof is housed in the recess-shaped portion. The connection part is covered with an insulating member.

12 Claims, 21 Drawing Sheets

(56) References Cited

U.S. PATENT DOCUMENTS

2017/0218982 A1\* 8/2017 Ozawa .................. F04D 29/667
2017/0264038 A1\* 9/2017 Ozawa ................ F16K 31/0675

FOREIGN PATENT DOCUMENTS

| JP | 2002-031263 A | 1/2002 |
| JP | 2004-028186 A | 1/2004 |
| JP | 2009-197949 A | 9/2009 |
| JP | 2009-197950 A | 9/2009 |
| JP | 2010-216552 A | 9/2010 |
| JP | 2012-164447 A | 8/2012 |

\* cited by examiner

CONNECTOR MODULE AND HYDRAULIC PRESSURE CONTROL DEVICE

CROSS-REFERENCE TO RELATED APPLICATION(S)

The present application claims priority to and incorporates by reference the entire contents of Japanese Patent Application No. 2016-045699 filed in Japan on Mar. 9, 2016.

BACKGROUND OF THE INVENTION

1. Field of the Invention

The present invention relates to a connector module and a hydraulic pressure control device.

2. Description of the Related Art

Technologies related to a hydraulic pressure control device including a hydraulic pressure circuit body in which a hydraulic pressure circuit configured to cause an operating fluid for an object to be controlled to flow and an electromagnetic valve that is mounted to the hydraulic pressure circuit body in order to adjust the flow rate of the operating fluid in the hydraulic pressure circuit have been conventionally known (Japanese Patent Application Laid-open No. 11-8023, Japanese Patent Application Laid-open No. 2010-216552, Japanese Patent Application Laid-open No. 2002-31263, Japanese Patent Application Laid-open No. 8-51019, Japanese Patent Application Laid-open No. 9-306558, Japanese Patent Application Laid-open No. 2012-164447, Japanese Patent Application Laid-open No. 2004-28186, Japanese Patent No. 5112907, and Japanese Patent No. 5112908).

The hydraulic pressure control device is provided with a connector module configured to electrically connect the electromagnetic valve to a control unit configured to control driving of the electromagnetic valve. Known examples of the connector module include a connector module configured to connect the members by a wire harness, a connector module configured to connect the members by a bus bar formed with a metal plate as a base material, a connector module configured to connect the members by a flexible printed wiring board (what is called a flexible printed circuit (FPC)), a connector module in which a wire-routed circuit body obtained by folding rigid wires is arranged on a single faceplate of a base member and which is configured to connect the members by the wire-routed circuit body, a connector module configured to connect the members by electrical wires wired on a single faceplate of a case, and a connector module in which a flexible printed wiring board is interposed between the electrical wires on the faceplate and a control unit. The electrical wire on the faceplate of the case is electrically connected to an insulation displacement terminal for the electromagnetic valve exposed on the faceplate. The conventional connector modules including those, however, have room for improvement in terms of suppressing the cost while obtaining satisfactory productivity and durability.

SUMMARY OF THE INVENTION

It is therefore an object of the present invention to provide a connector module and a hydraulic pressure control device capable of obtaining satisfactory productivity and durability and suppressing the cost.

In order to achieve the above mentioned object, a connector module according to one aspect of the present invention includes an electrical connection structure including a plurality of electrical wires and a wiring plate on which the electrical wires are wired, wherein each of the electrical wires is coated with an insulating coating, and includes a wiring portion wired on the wiring plate, and an electrical connection portion to be physically and electrically connected to a counterpart electrical connection portion, the wiring plate includes a surrounded recess-shaped portion, the electrical connection portion and the counterpart electrical connection portion are arranged in the recess-shaped portion and formed such that a physical and electrical connection part thereof is housed in the recess-shaped portion, and the connection part is covered with an insulating member.

According to another aspect of the present invention, in the connector module, it is preferable that the insulating member is formed by solidifying an insulating synthetic resin material poured into the recess-shaped portion.

According to still another aspect of the present invention, in the connector module, it is preferable that when a plurality of the connection parts are housed in the recess-shaped portion, an insulating synthetic resin material is poured into the recess-shaped portion and solidified under a state in which the connection parts are housed while being separated from one another with gaps, to form the insulating member configured to cover each of the connection parts.

According to still another aspect of the present invention, in the connector module, it is preferable that the recess-shaped portion is formed by being recessed from a wiring surface of the wiring plate on which the wiring portion is wired, and the electrical connection portion is offset from the wiring portion so as to be arranged in the recess-shaped portion.

According to still another aspect of the present invention, in the connector module, it is preferable that the electrical connection structures are arranged adjacent to each other, in each of the electrical connection structures arranged adjacent to each other, the electrical connection portion of the electrical wire on one end side is physically and electrically connected to the counterpart electrical connection portion of a corresponding electrical connection target, and a part of the electrical wire in one of the electrical connection structures closer to another end than the wiring portion and a part of the electrical wire in another of the electrical connection structure closer to another end than the wiring portion have an electrical connection relation, and a movable portion capable of changing a relative positional relation between the electrical connection structures arranged adjacent to each other is provided between the electrical connection structures.

A hydraulic pressure control device according to still another aspect of the present invention includes a hydraulic pressure circuit body including a hydraulic pressure circuit configured to cause an operating fluid for an object to be controlled to flow; a control unit configured to control a flow rate of the operating fluid in the hydraulic pressure circuit; an electromagnetic valve that is connected to the hydraulic pressure circuit body and is controlled to be driven by the control unit so as to adjust the flow rate of the operating fluid in the hydraulic pressure circuit; and an electrical connection structure including a plurality of electrical wires and a wiring plate on which the electrical wires are wired, wherein each of the electrical wires is coated with an insulating coating, and includes a wiring portion wired on the wiring plate, and an electrical connection portion to be physically and electrically connected to one of counterpart electrical connection portions on the electromagnetic valve side and the control unit side, the wiring plate includes a surrounded recess-shaped portion, the electrical connection portion and the counterpart electrical connection portion are formed so as to be arranged in the recess-shaped portion and such that a physical and electrical connection part thereof is housed in the recess-shaped portion, and the connection part is covered with an insulating member.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Referring to the accompanying drawings, a connector module and a hydraulic pressure control device according to embodiments of the present invention are described in detail below. The present invention is not limited by the embodiments.

EMBODIMENTS

A connector module and a fluid pressure control device according to one embodiment of the present invention are described with reference to FIG. 1 to FIG. 22.

The hydraulic pressure control device according to the present invention is configured to adjust the flow rate of an operating fluid fed to an object to be controlled, and change the fluid pressure of the operating fluid, thereby controlling the operation of the object to be controlled. The hydraulic pressure control device includes a hydraulic pressure circuit body configured to cause the operating fluid fed under pressure from a pump to flow inside the hydraulic pressure circuit body, and at least one electromagnetic valve configured to adjust the flow rate of the operating fluid. The hydraulic pressure circuit body has a hydraulic pressure circuit formed therein, which serves as a flow path for the operating fluid. The electromagnetic valve is a control valve capable of adjusting the flow rate of the operating fluid in the hydraulic pressure circuit.

Any object to be controlled can be employed as long as the object to be controlled operates by using the fluid pressure of the operating fluid. Any operating fluid can be employed as long as the operating fluid operates the object to be controlled. In the present embodiment, an automatic transmission mounted on a vehicle such as an automobile is exemplified as an object to be controlled. Thus, an operating oil (automatic transmission fluid (ATF)) that serves for operation and lubrication of the automatic transmission is used as the operating fluid. In the following, "object to be controlled" is replaced with "automatic transmission" for description. In the following, "operating fluid" is replaced with "operating oil" and "fluid pressure" is replaced with "oil pressure" for description.

Figure 1:
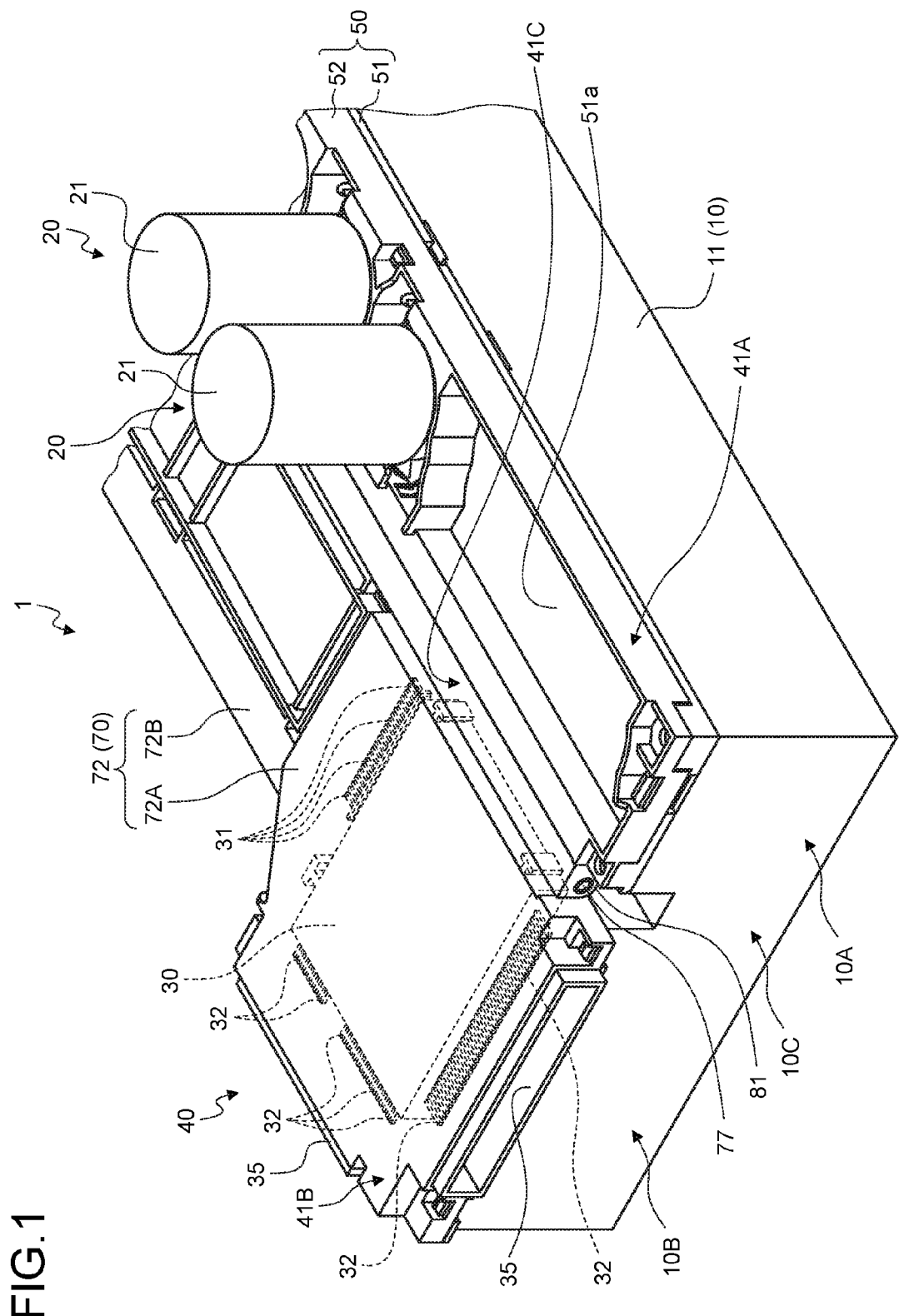
FIG. 1 is a perspective view illustrating an example of a connector module and an oil pressure control device (hydraulic pressure control device)
Figure 2:
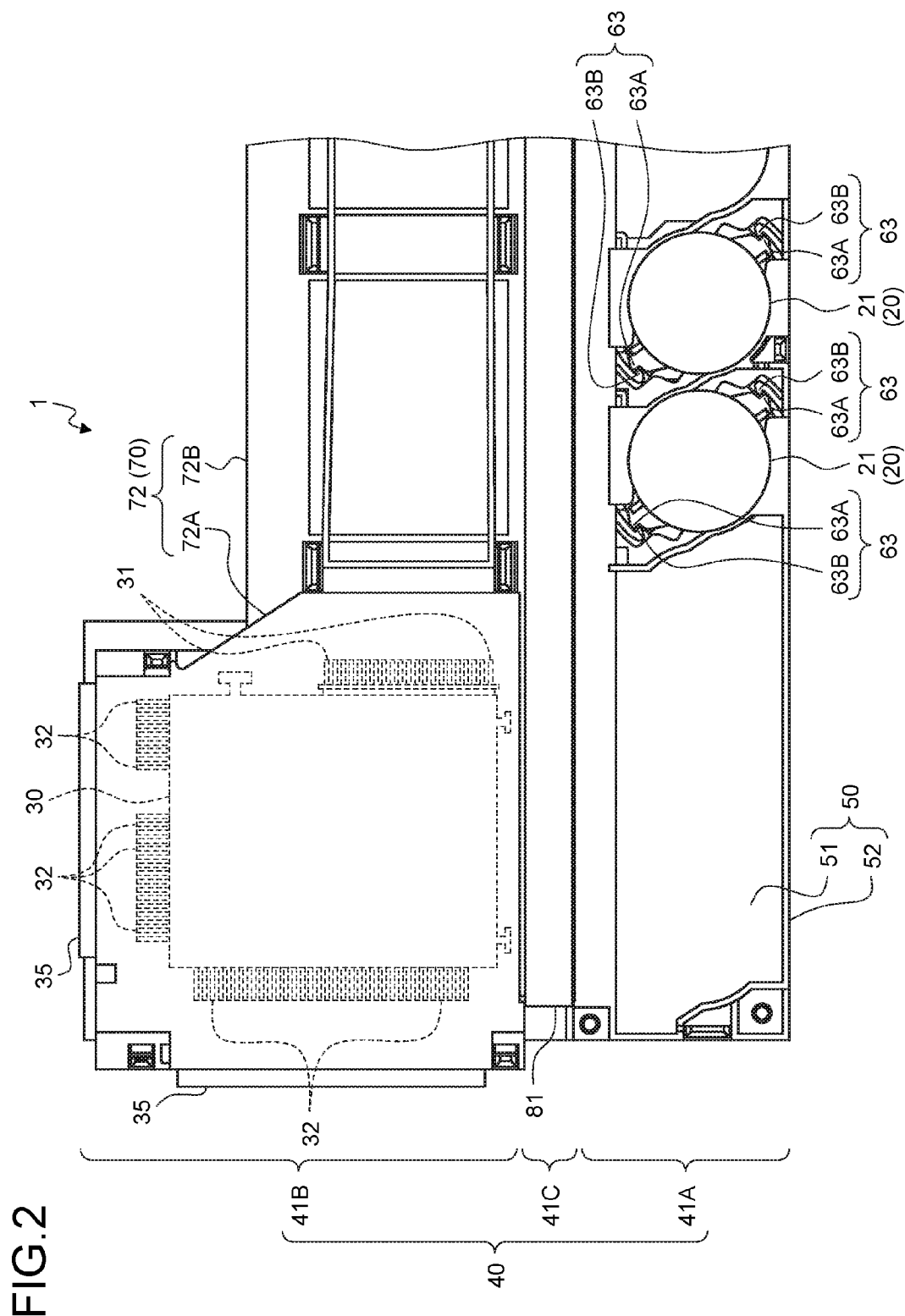
FIG. 2 is a top view illustrating an example of the connector module and the oil pressure control device (hydraulic pressure control device)

Reference numeral 1 in FIG. 1 and FIG. 2 denotes an oil pressure control device according to the present embodiment. The oil pressure control device 1 includes an oil pressure circuit body 10, an electromagnetic valve 20, a control unit 30, and a connector module 40. The oil pressure control device 1 causes the control unit 30 to control driving of the electromagnetic valve 20, thereby adjusting the oil pressure inside the oil pressure circuit body 10 that is so called valve body, and executing the control of the automatic transmission in accordance with the oil pressure. In the oil pressure control device 1, the electromagnetic valve 20 and the control unit 30 are arranged on the oil pressure circuit body 10 through the connector module 40. The oil pressure control device 1 in FIG. 1 and FIG. 2 is an excerpt of a part of the oil pressure circuit body 10.

Figure 3:
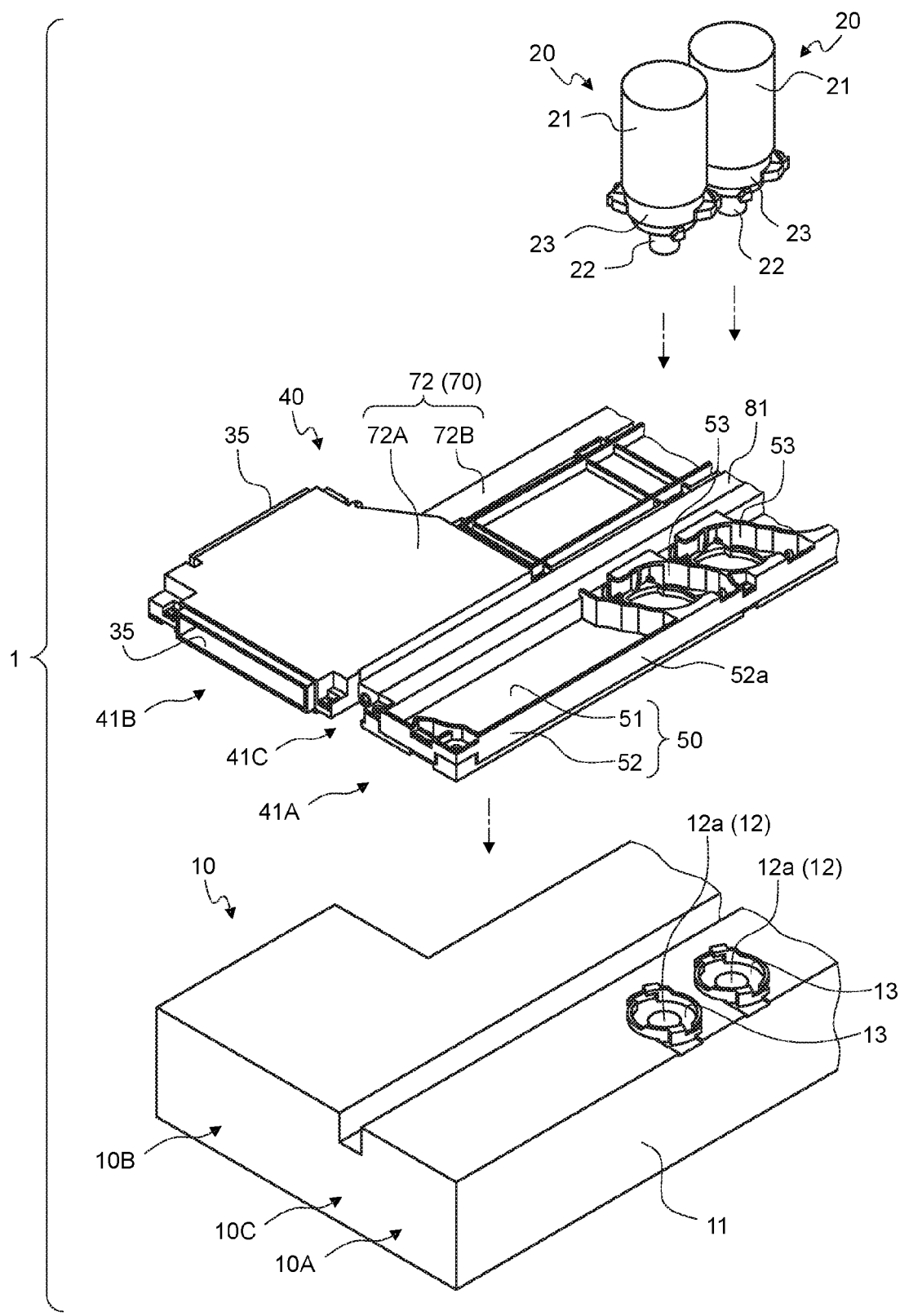
FIG. 3 is an exploded perspective view of the oil pressure control device (hydraulic pressure control device)

The oil pressure circuit body 10 is what is called a valve body. The exemplified oil pressure circuit body 10 is roughly divided into a drive system arrangement portion 10A in which the electromagnetic valve 20 is arranged, a control system arrangement portion 10B in which the control unit 30 is arranged, and a coupling portion 100 that couples the drive system arrangement portion 10A and the control system arrangement portion 10B to each other (FIG. 1 and FIG. 3). The exemplified oil pressure circuit body 10 is obtained by integrally forming the drive system arrangement portion 10A, the control system arrangement portion 10B, and the coupling portion 10C with predetermined materials (such as metal material and synthetic resin material).

Figure 4:
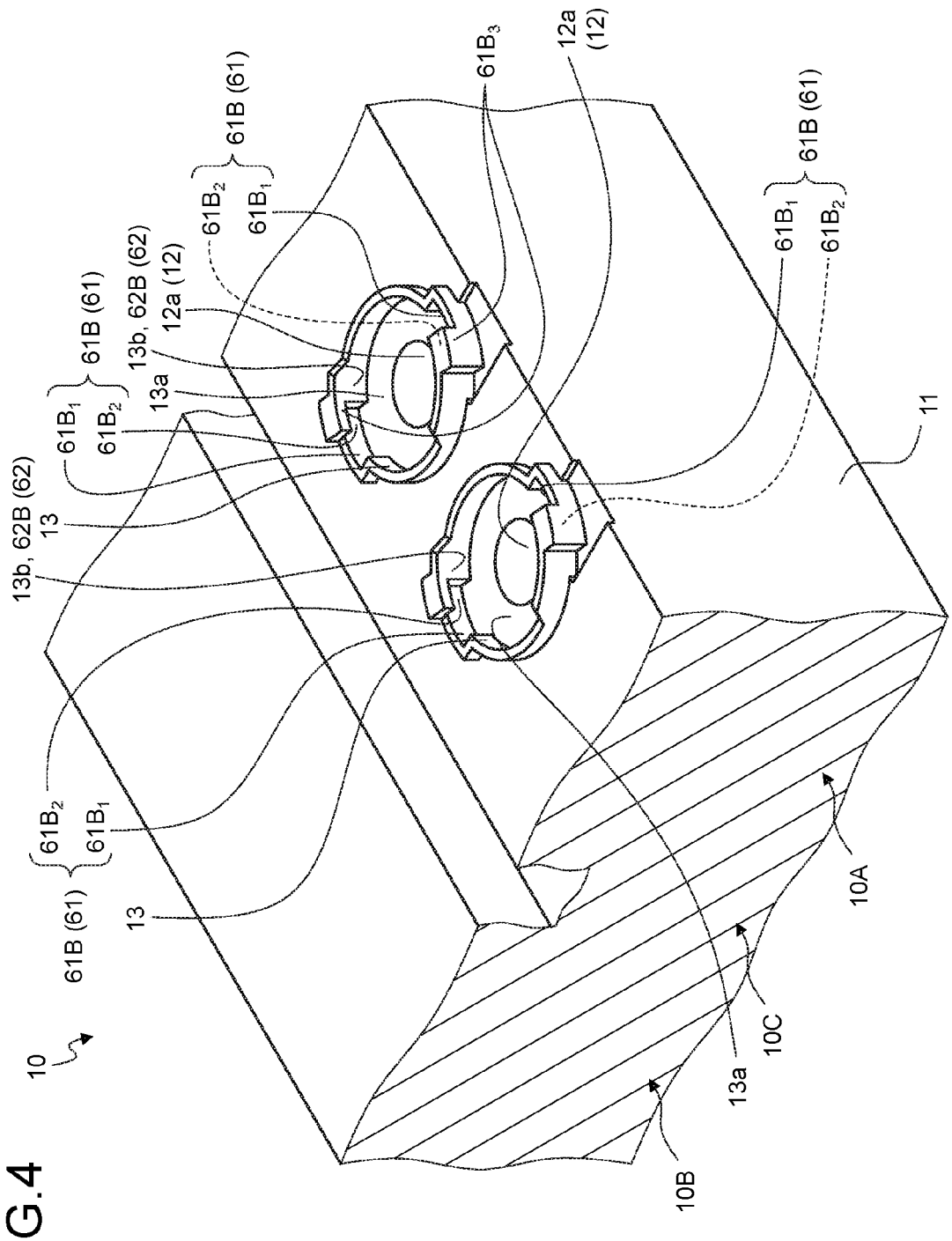
FIG. 4 is a perspective view of an oil pressure circuit body (hydraulic pressure circuit body)

In the oil pressure circuit body 10, a principal portion 11 is formed by the drive system arrangement portion 10A, the control system arrangement portion 10B, and the coupling portion 10C. In the oil pressure circuit body 10, an oil pressure circuit 12 configured to cause an operating oil for an automatic transmission (not illustrated) to flow is formed inside the principal portion 11 (FIG. 3 and FIG. 4). The oil pressure circuit 12 includes a main flow path (not illustrated) that serves as a flow path for the operating oil for the automatic transmission between a pump side and a control mechanism side (such as a brake and a clutch), and a flow rate adjustment path 12a that communicates with the main flow path on the route of the main flow path.

The main flow path connects an inlet for the operating oil fed under pressure from the pump side and a discharge port through which the operating oil is discharged to the control mechanism side. The main flow path is provided with various flow paths corresponding to shift gears of the automatic transmission. The flow rate adjustment path 12a is a columnar path through which a valve body 22 of the electromagnetic valve 20 described later reciprocates, and is provided for each valve body 22. The valve body 22 adjusts the flow rate of the operating oil in the main flow path in accordance with the position of the valve body 22 in the flow rate adjustment path 12a.

Figure 5:
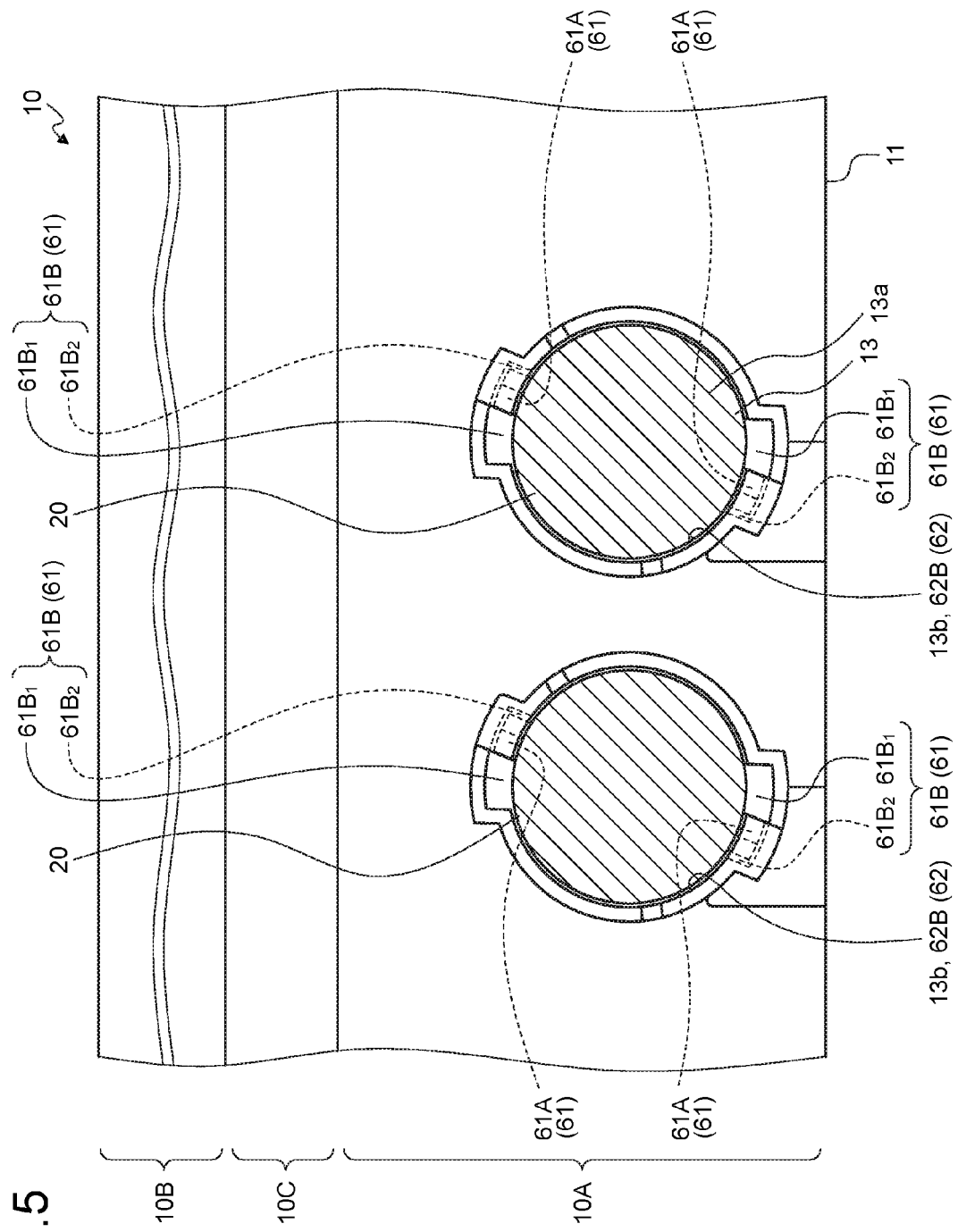
FIG. 5 is a top view of the oil pressure circuit body (hydraulic pressure circuit body)

In the oil pressure circuit body 10, a columnar housing space 13 that communicates the oil pressure circuit 12 with the outside is provided. The housing space 13 is arranged concentrically with the flow rate adjustment path 12a to communicate with the flow rate adjustment path 12a. The housing space 13 is a space in which a housing body 23 of the electromagnetic valve 20 to be described later is housed, and has an outer diameter larger than that of the flow rate adjustment path 12a. Thus, a bottom portion 13a of the housing space 13 is annularly formed on the oil pressure circuit body 10 (FIG. 4 and FIG. 5). An annular distal end surface 23a (FIG. 6 and FIG. 7) of the housing body 23 comes into contact with the bottom portion 13a when the housing body 23 is housed in the housing space 13.

Figure 6:
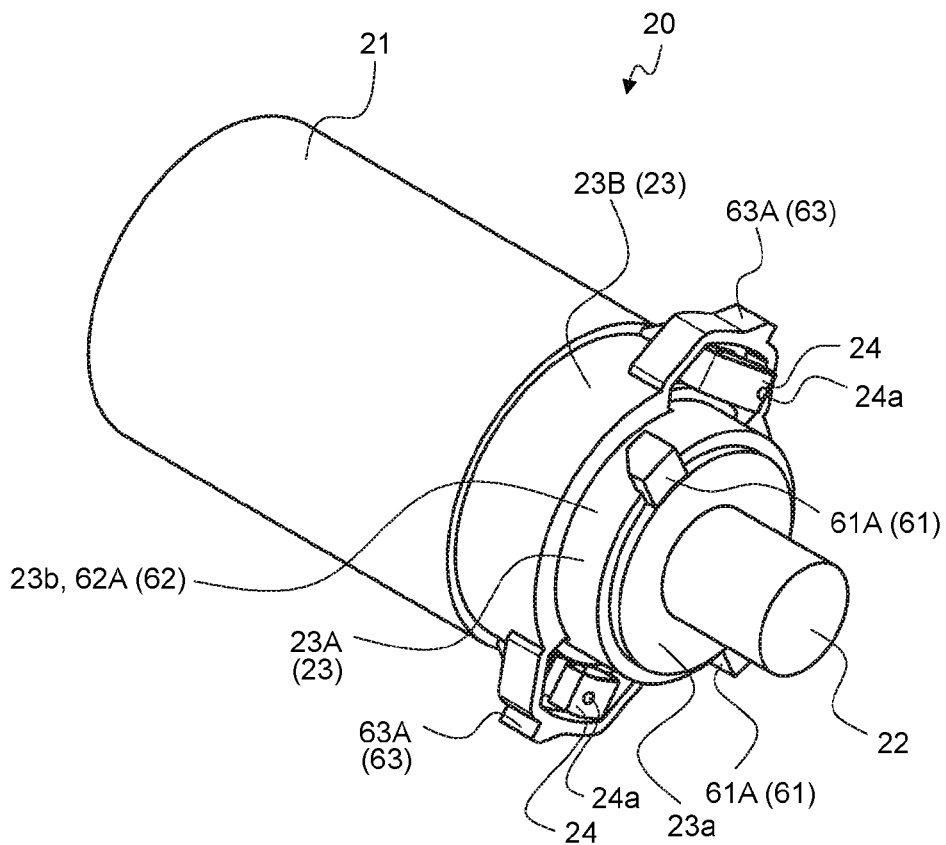
FIG. 6 is a perspective view of an electromagnetic valve.
Figure 7:
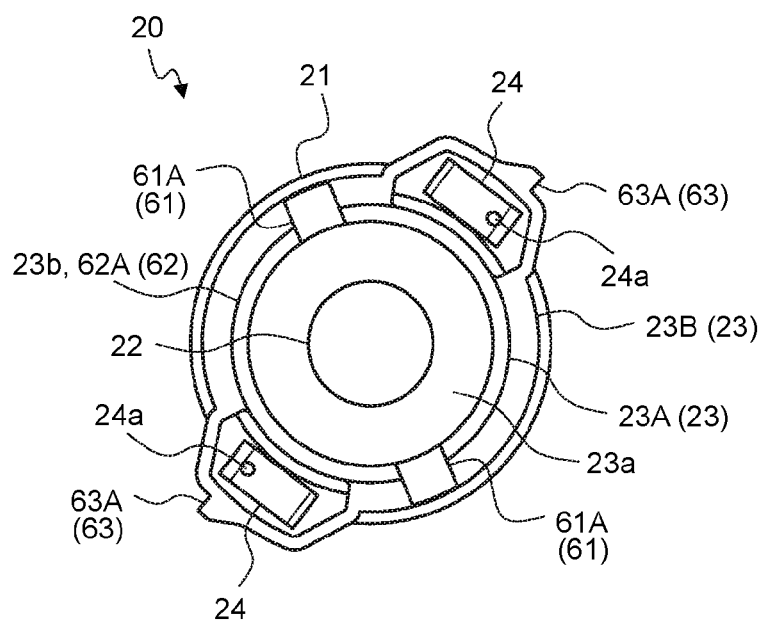
FIG. 7 is a view of the electromagnetic valve as seen from a valve body.

The electromagnetic valve 20 includes a main body 21 in which a drive mechanism such as a coil and a return spring is housed, and the valve body 22 configured to reciprocate in the axial direction by the drive mechanism (FIG. 3, FIG. 6, and FIG. 7). The valve body 22 in the figures has a columnar shape for the sake of convenience, but the shape is not limited. For example, the valve body 22 is prepared in accordance with the configuration of the oil pressure circuit 12, and may be of a spool type obtained by concentrically combining columns having different outer diameters (what is called spool valve). The valve body 22 is arranged concentrically with the flow rate adjustment path 12a, and reciprocates in the flow rate adjustment path 12a along the central axis of the valve body 22.

The electromagnetic valve 20 is provided with the cylindrical or annular housing body 23 arranged concentrically with the valve body 22. The housing body 23 is inserted and housed in the housing space 13 in the oil pressure circuit body 10 along the axial direction of the central axis. The electromagnetic valve 20 is connected to the oil pressure circuit body 10 while housed in the housing space 13. In the electromagnetic valve 20, the housing body 23 is continuous to the main body 21, and the valve body 22 protrudes from the housing body 23 in a reciprocable manner. The exemplified housing body 23 is formed by providing concentric first and second housing bodies 23A and 23B having different outer diameters (FIG. 6 and FIG. 7). In FIG. 6 and FIG. 7, the first housing body 23A includes two cylindrical or annular bodies having different outer diameters, but is described as being a single cylindrical or annular body for the sake of description. The second housing body 23B has an outer diameter larger than that of the first housing body 23A and is arranged closer to the main body 21 than the first housing body 23A is.

The electromagnetic valve 20 is further provided with terminals 24 electrically connected to its drive mechanism. Each terminal 24 is formed by folding a plate-shaped base material made of a conductive material such as metal in order to exhibit a repulsive force, and generates warpage when load is applied to a valve-side contact 24a described later.

The control unit 30 is a control unit (what is called electronic control unit (ECU)) serving the control operation of the oil pressure control device 1, and is configured to control the driving of the electromagnetic valve 20 to control the flow rate of the operating oil in the oil pressure circuit 12. The control unit 30 transmits an instruction to the electromagnetic valve 20 to be controlled in accordance with a target shift gear of the automatic transmission, and controls the driving of the electromagnetic valve 20 to the open side or closed side. For the control unit 30, at least the electromagnetic valve 20 is an object to be directly controlled, and the automatic transmission is an object to be indirectly controlled. The control unit 30 is provided with a plurality of terminals 31 to be electrically connected to a counterpart electrical connection target (such as an object to be directly controlled and a sensor) via the connector module 40, and a plurality of terminals 32 to be electrically connected to a counterpart electrical connection target (not illustrated) such as a power supply not via the connector module 40 (FIG. 1 and FIG. 2).

The connector module 40 is configured to electrically connect at least two electrical connection targets. The connector module 40 is provided with at least one electrical connection structure that serves to connect the electrical connection targets. The electrical connection structure includes a plurality of electrical wires and a wiring plate on which the electrical wires are wired. Each electrical wire is coated with an insulating coating, and has a wiring portion wired on the wiring plate and an electrical connection portion to be physically and electrically connected to a counterpart electrical connection portion. The counterpart electrical connection portion is an electrical connection portion of a counterpart that is provided on the electrical connection target side of the electrical connection portion in the electrical connection structure. The counterpart electrical connection portion is directly included in an electrical connection target in some cases and is interposed between the electrical connection target and an electrical connection portion in the electrical connection structure in other cases. The electrical wires are wired by using a wiring machine (not illustrated), for example.

In the case where the connector module 40 is formed by a single electrical connection structure, both ends of the electrical wire each serve as an electrical connection portion, and a wiring portion is provided between the electrical connection portions. In the electrical wire, when one electrical connection portion is physically and electrically connected to a counterpart electrical connection portion on one electrical connection target side (for example, on the electromagnetic valve 20 side), the one electrical connection portion is directly or indirectly and electrically connected to the one electrical connection target. In the electrical wire, when the other electrical connection portion is physically and electrically connected to a counterpart electrical connection portion on the other electrical connection target side (for example, on the control unit 30 side), the other electrical connection portion is directly or indirectly and electrically connected to the other electrical connection target.

In such the connector module 40 formed by a single electrical connection structure, a physical and electrical connection part (one connection part) between one electrical connection portion and the counterpart electrical connection portion on the one electrical connection target side and a physical and electrical connection part (the other connection part) between the other electrical connection portion and the counterpart electrical connection portion on the other electrical connection target side are formed. In the wiring plate in this case, a surrounded recess-shaped portion is formed correspondingly to the arrangement of at least one of one connection part and the other connection part. In the recess-shaped portion, a corresponding connection part is housed.

In the case where the connector module 40 is formed by a plurality of electrical connection structures, at least two electrical connection structures among the electrical connection structures are arranged adjacent to each other. In each of the electrical connection structures arranged adjacent to each other, one electrical connection target (for example, the electromagnetic valve 20) is electrically connected to one electrical connection structure, and the other electrical connection target (for example, the control unit 30) is electrically connected to the other electrical connection structure. In the one electrical connection structure, an electrical connection portion of the electrical wire on one end side is physically and electrically connected to a counterpart electrical connection portion on the one electrical connection target side. In the other electrical connection structure, an electrical connection portion of the electrical wire on one end side is physically and electrically connected to a counterpart electrical connection portion on the other electrical connection target side. In each of the electrical connection structures arranged adjacent to each other, a part of the electrical wire in one electrical connection structure closer to the other end than the wiring portion and a part of the electrical wire in the other electrical connection structure closer to the other end than the wiring portion have an electrical connection relation. Thus, the connector module 40 can electrically connect two electrical connection targets. The electrical connection relation between the electrical connection structures may be established by electrically connecting electrical wires provided individually to the electrical connection structures by welding or by using terminals. In this case, the other end side of one of the electrical wires is a counterpart electrical connection portion for the other end side of the other electrical wire, and the other end side of the other electrical wire is a counterpart electrical connection portion for the other end side of the one electrical wire. The electrical connection relation between the electrical connection structures may be established by electrical wires that are arranged to close the electrical connection structures. Each electrical wire arranged to close the electrical connection structures has wiring portions wired on wiring plates of the respective electrical connection structures, electrical connection portions on both end sides, and a movable electrical wire portion arranged between the wiring portions and in a movable portion described later. Specifically, in the connector module 40, the electrical connection structures arranged adjacent to each other may be connected in a manner that the electrical wires in the electrical connection structures are physically and electrically connected together or by electrical wires that cross the electrical connection structures.

In the case of the connector module 40 formed by a plurality of electrical connection structures, in one of the electrical connection structures arranged adjacent to each other, a physical and electrical connection part (one connection part) between one electrical connection portion and a counterpart electrical connection portion on one electrical connection target side is formed, and in the other electrical connection structure, a physical and electrical connection part (other connection part) between the other electrical connection portion and a counterpart electrical connection portion on the other electrical connection target side is formed. In a wiring plate in at least one of the electrical connection structures arranged adjacent to each other, a surrounded recess-shaped portion is formed so as to correspond to the arrangement of connection parts between the electrical connection portion and the counterpart electrical connection portion. Also in this case, a corresponding connection part is housed in the recess-shaped portion.

A movable portion capable of changing the relative positional relation between the electrical connection structures arranged adjacent to each other is provided therebetween. Thus, the connector module 40 is easily adaptable to the shape and arrangement of a counterpart to which each electrical connection structure is mounted.

Regardless of the number of electrical connection structures forming the connector module 40, when a recess-shaped portion is formed, an electrical connection portion and a counterpart electrical connection portion are arranged in the recess-shaped portion and are formed such that a physical and electrical connection part therebetween is housed in the recess-shaped portion. In the connector module 40, the connection part is covered with an insulating member (for example, a member obtained by solidifying an insulating synthetic resin material poured in the recess-shaped portion) to secure the insulating property of the connection part. A recess-shaped portion may be formed for each connection part or may be formed so as to house a plurality of connection parts therein. In the case where connection parts are housed in a recess-shaped portion, an insulating synthetic resin material is poured in the recess-shaped portion under the state in which the connection parts are housed with gaps, and the insulating synthetic resin material is solidified. In this manner, the connection parts can be covered with a single insulating member.

Specifically, the exemplified connector module 40 electrically connects two kinds of counterpart electrical connection targets, and is provided with an electrical connection structure for each kind of electrical connection target. One of the two kinds of counterpart electrical connection targets is the electromagnetic valve 20, and the other is the control unit 30. In the exemplified connector module 40, the two electrical connection structures are arranged side by side. One of the electrical connection structures arranged adjacent to each other is formed so as to electrically connect the electromagnetic valve 20 as an electrical connection target to its own electrical connection portion. The other of the electrical connection structures arranged adjacent to each other is formed so as to electrically connect the control unit 30 as an electrical connection target to its own electrical connection portion.

Figure 8:
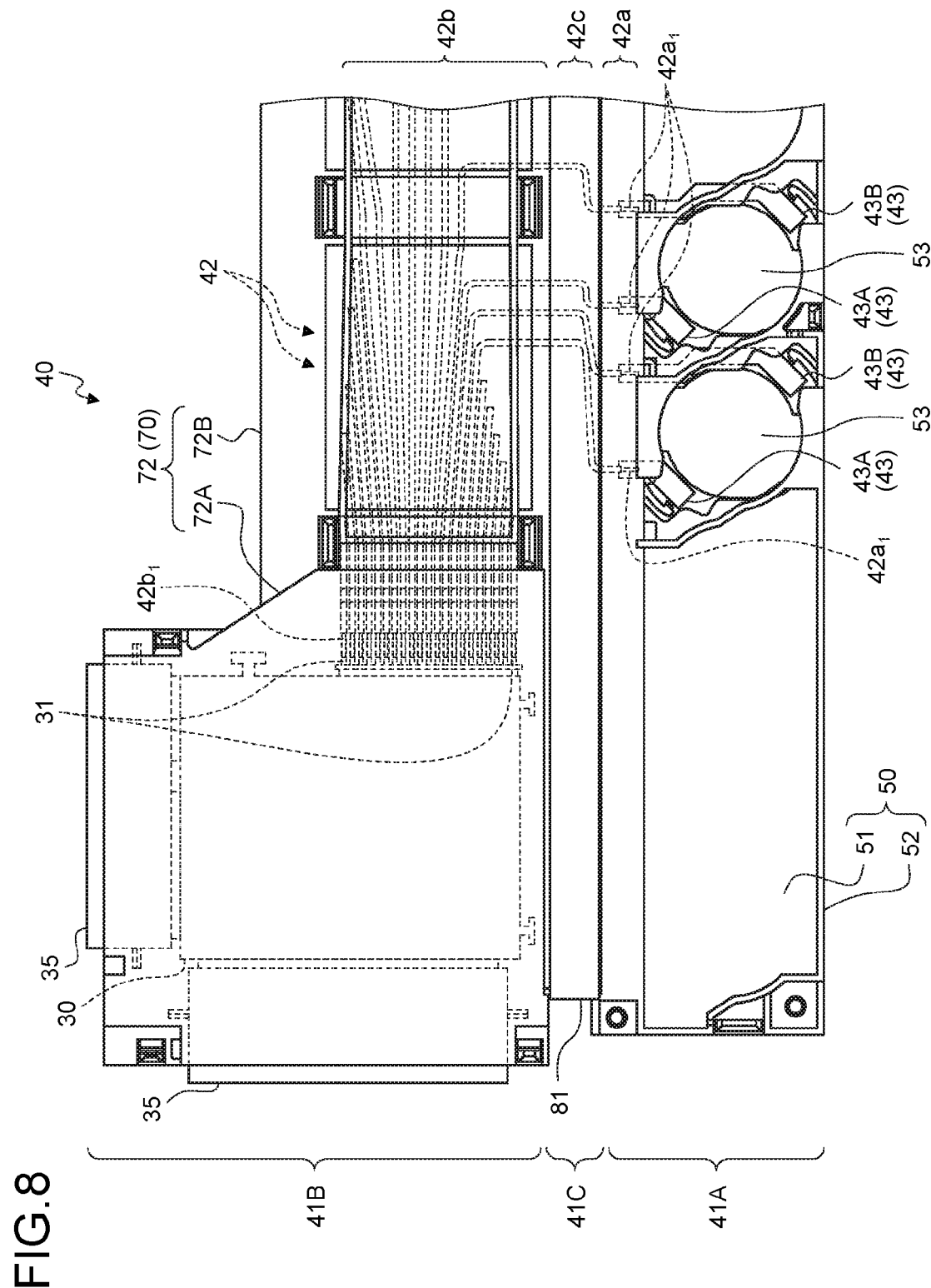
FIG. 8 is a top view illustrating an example of a connector module and an oil pressure control device (hydraulic pressure control device), illustrating a principal part of the internal structure of the connector module.
Figure 9:
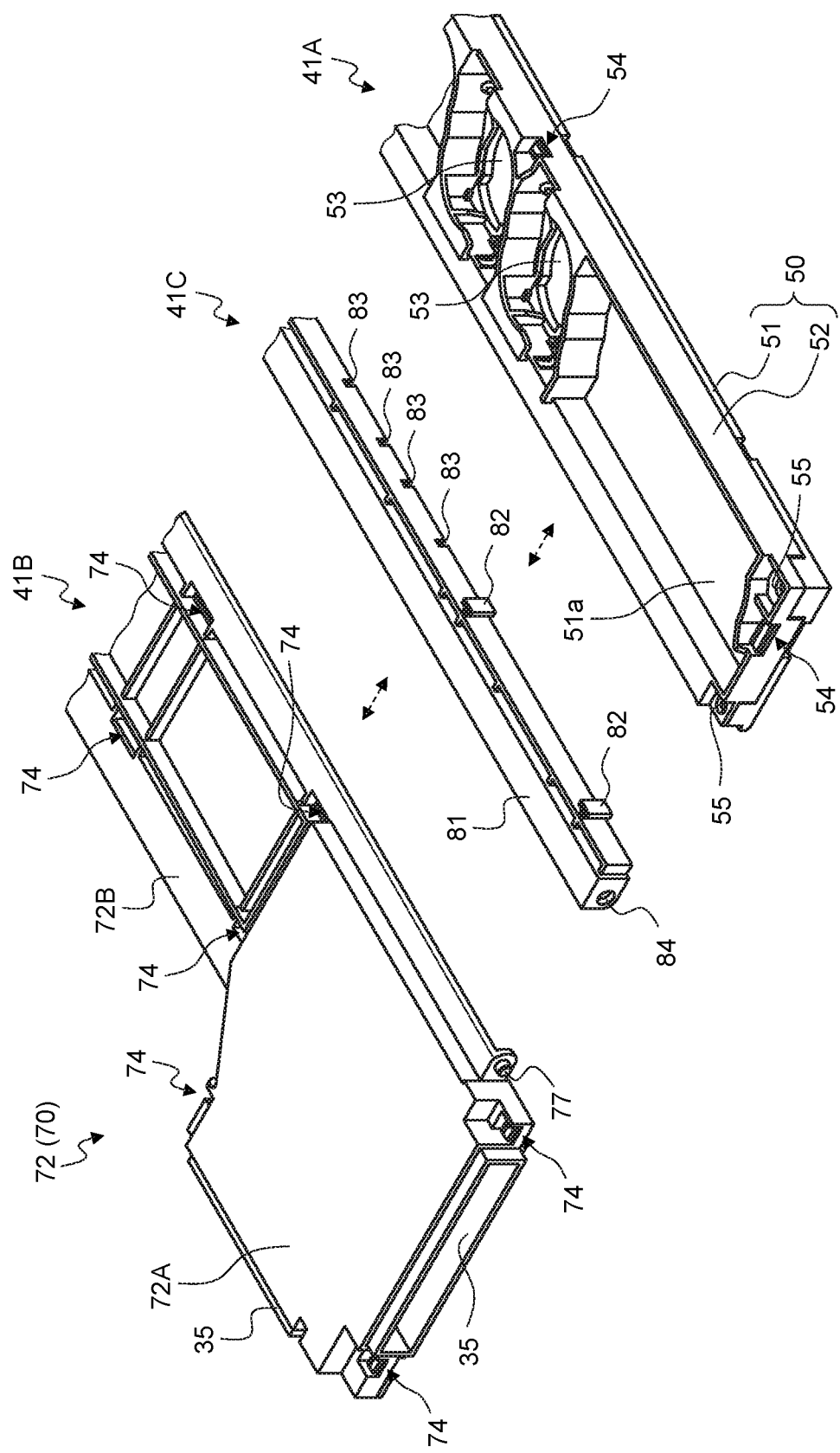
FIG. 9 is an exploded perspective view of the connector module.

The exemplified connector module 40 is provided with a first electrical connection structure 41A whose counterpart electrical connection target is the electromagnetic valve 20 and a second electrical connection structure 41B whose counterpart electrical connection target is the control unit 30 (FIG. 1 to FIG. 3, FIG. 8, and FIG. 9). The connector module 40 is further provided with a movable portion 41C capable of changing the relative positional relation between the first electrical connection structure 41A and the second electrical connection structure 41B. FIG. 9 omits electrical wires 42 described later for the sake of convenience. The connector module 40 formed from a single electrical connection structure as described above corresponds to the one in which the first electrical connection structure 41A, the second electrical connection structure 41B, and the movable portion 41C are integrated so as not to change the relative positional relation thereamong. The connector module 40 in this case is provided with, for example, a housing body having a wiring plate, and electrical wires are wired in the housing body. The housing body corresponds to, for example, the one in which a first housing member 50 in the first electrical connection structure 41A, a second housing member 70 in the second electrical connection structure 41B, and a coupling member 81 in the movable portion 41C are integrated so as not to change the relative positional relation thereamong.

The exemplified connector module 40 is taken as an example where a plurality of electrical wires 42 that cross the first electrical connection structure 41A and the second electrical connection structure 41B are provided. Two electrical wires 42 are provided for each electromagnetic valve 20. Each electrical wire 42 has a first wiring portion 42a arranged in the first electrical connection structure 41A and a second wiring portion 42b arranged in the second electrical connection structure 41B (FIG. 8). The electrical wire 42 has, on one end side thereof (on one end side of the first wiring portion 42a), a first electrical connection portion $42a_1$ directly or indirectly and electrically connected to the electromagnetic valve 20. The electrical wire 42 has, on the other end side thereof (on one end side of the second wiring portion 42b), a second electrical connection portion $42b_1$ directly or indirectly and electrically connected to the control unit 30.

The electrical wire 42 further has a coupling portion 42c that connects the other end side of the first wiring portion 42a and the other end side of the second wiring portion 42b to each other. The coupling portion 42c functions as a movable electrical wire portion in the movable portion 41C, and is flexible so as to be deformable. The flexibility of the coupling portion 42c enables the relative positional relation between the first electrical connection structure 41A and the second electrical connection structure 41B to be changed. Taking this feature into configuration, any kind of the electrical wire 42 can be used as long as at least the coupling portion 42c has flexibility after being wired.

For example, a solid wire or a stranded wire is used as a conductor of the electrical wire 42. The conductor of the electrical wire 42 is coated with an insulating coating. In some cases, the connector module 40 is arranged in a location immersed in an operating oil for an automatic transmission, and the operating oil can flow to the inside of the connector module 40. Thus, in the case of such arrangement, a coating is formed from an insulating material resistant to properties (for example, physical properties of an additive and oil temperature) of the operating oil. The exemplified connector module 40 is intended for such arrangement, and hence a coating is formed from a material (such as a synthetic resin) that is resistant to the properties of the operating oil and has insulating property. For example, the electrical wire 42 is provided with such a coating so as to cover the entire conductor. In the case of a coating of this type, the coating is peeled off at both end portions of the electrical wire 42 to expose the internal conductor, thereby forming the first electrical connection portion $42a_1$ and the second electrical connection portion $42b_1$. The exemplified electrical wire 42 is obtained by conductively plating a solid wire and covering the plated solid wire with a coating made of a fluorine resin.

Figure 10:
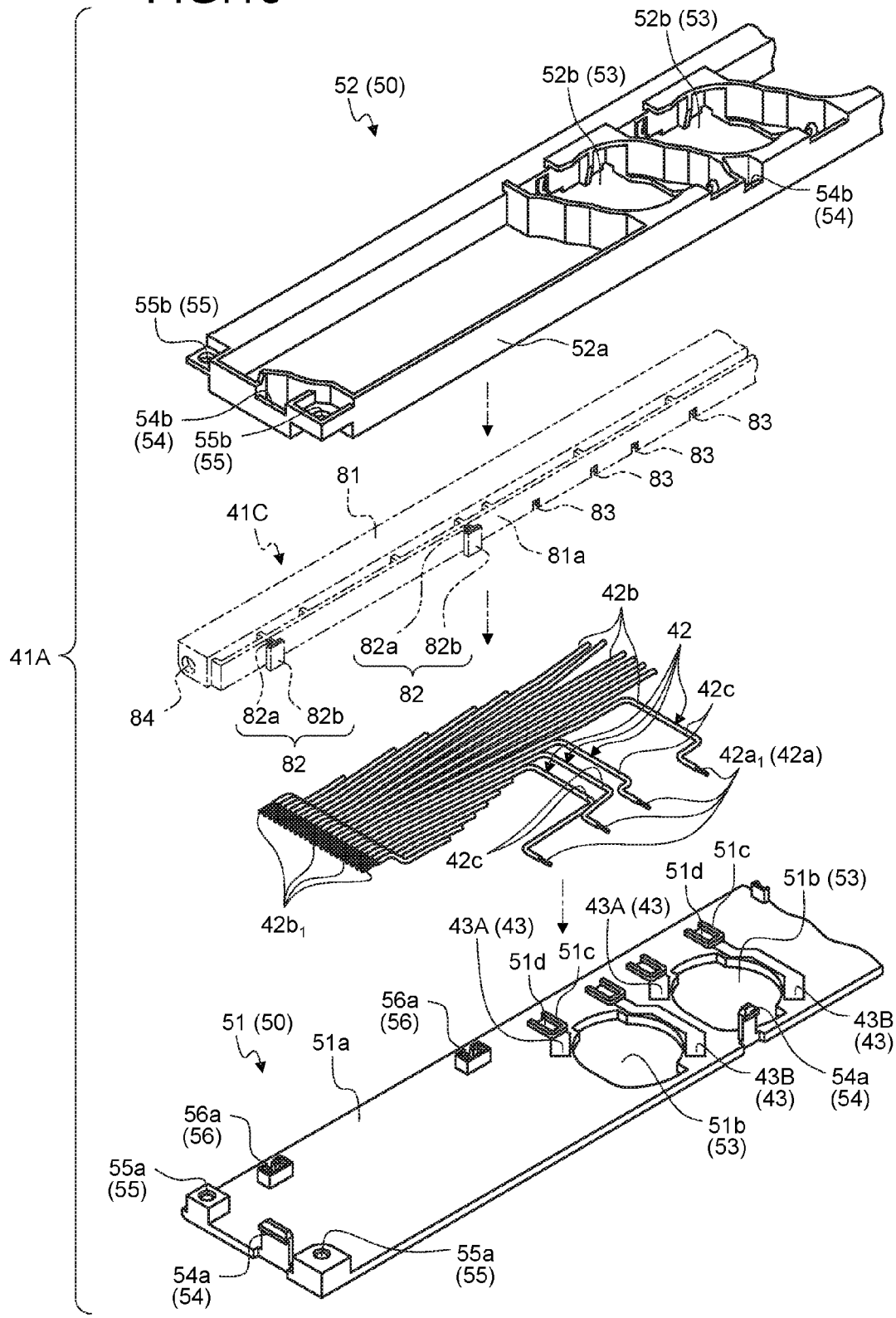
FIG. 10 is an exploded perspective view of a first electrical connection structure.
Figure 11:
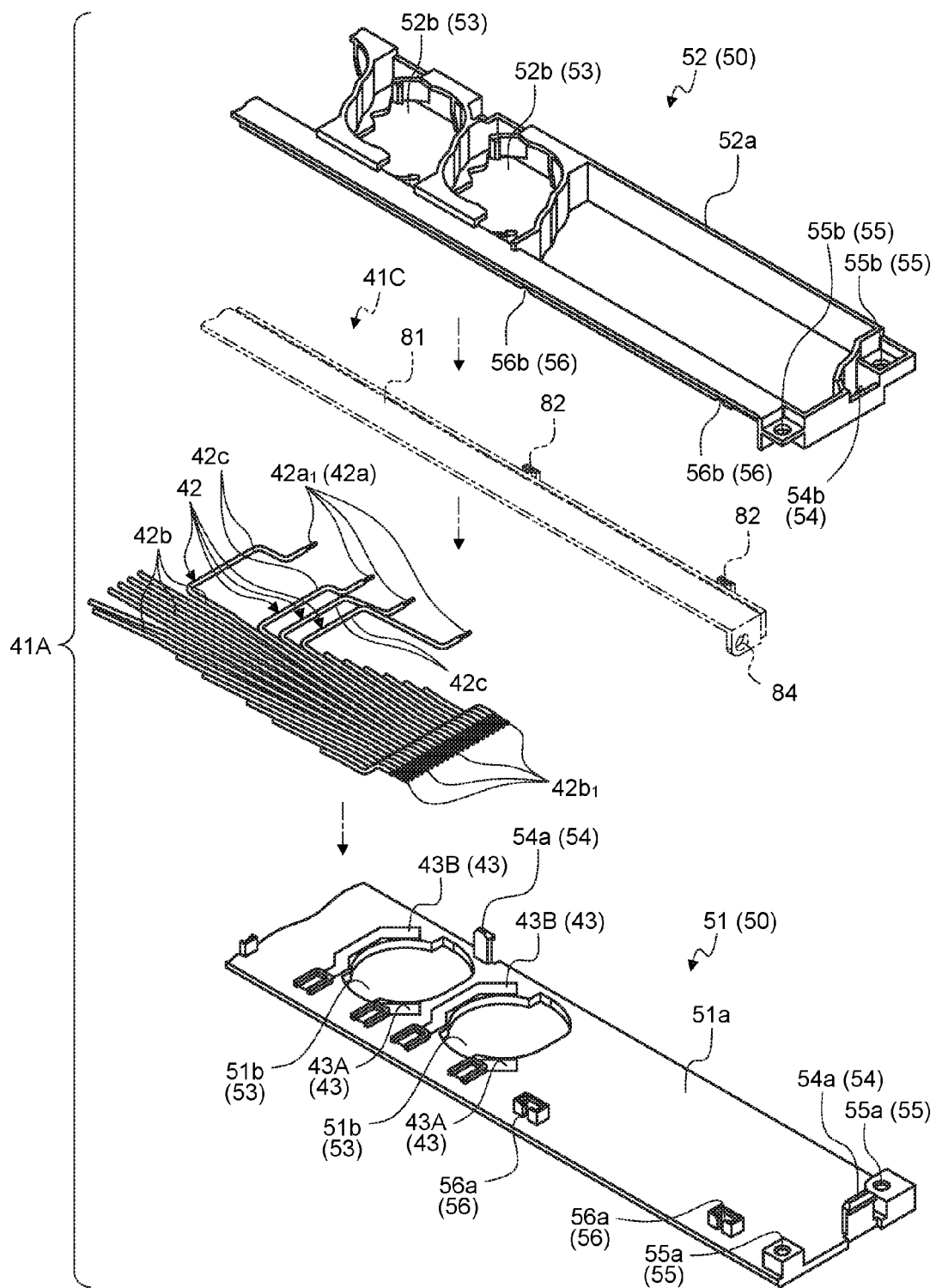
FIG. 11 is an exploded perspective view of the first electrical connection structure as seen from a different angle.
Figure 12:
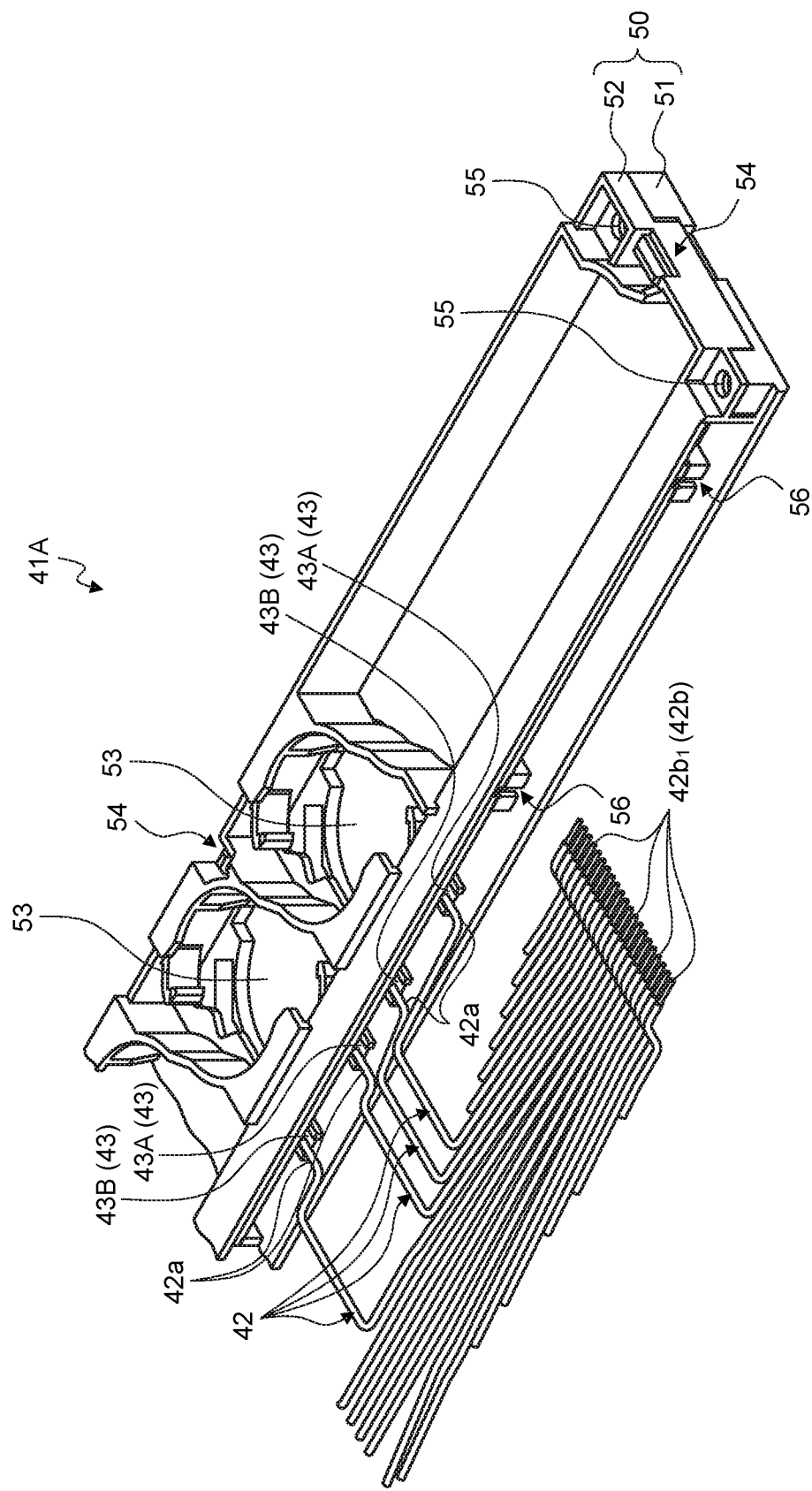
FIG. 12 is a perspective view of the first electrical connection structure.

First, the first electrical connection structure 41A is described. In the exemplified first electrical connection structure 41A, all components are formed from a material resistant to properties of operating oil for the same reason as for the coating of the electrical wire 42. In the exemplified first electrical connection structure 41A, as described above, the first wiring portion 42a and the first electrical connection portion $42a_1$ of the electrical wire 42 are arranged. In the first electrical connection structure 41A, the first electrical connection portion $42a_1$ is indirectly and electrically connected to the electromagnetic valve 20. Thus, the first electrical connection structure 41A is provided with a terminal 43 configured to electrically connect the first electrical connection portion $42a_1$ to the electromagnetic valve 20 (FIG. 10 to FIG. 12). The terminal 43 serves as a counterpart electrical connection portion for the first electrical connection portion $42a_1$. In the present example, a first terminal 43A and a second terminal 43B are provided for each electromagnetic valve 20 as the terminals 43. The first terminal 43A and the second terminal 43B are formed from conductive materials such as metal, and are members separate from the electrical wire 42. Thus, the terminals 43 (first terminal 43A and second terminal 43B) are physically and electrically connected to the first electrical connection portion $42a_1$ by a predetermined method. The predetermined method may be any method capable of physical and electrical connection therebetween. Examples of conceivable methods include welding (such as laser welding and resistance welding), soldering, and pressure bonding. The exemplified first terminal 43A and second terminal 43B are formed into a plate shape like what is called a bus bar. The first electrical connection portion $42a_1$ of the electrical wire 42 is welded to one flat part of each of the first terminal 43A and the second terminal 43B (FIG. 12).

The first electrical connection structure 41A is provided with the first housing member 50 configured to house therein the first wiring portions 42a and the first electrical connection portions $42a_1$ of the electrical wires 42 and the terminals 43 (first terminals 43A and second terminals 43B) (FIG. 8 to FIG. 12). In the first electrical connection structure 41A, a part of the first housing member 50 is used as a wiring plate. The first housing member 50 is mounted to the drive system arrangement portion 10A in the oil pressure circuit body 10, and is arranged so as to cover at least the periphery of the housing space 13. The exemplified first housing member 50 is roughly divided into a base member 51 and a cover member 52, and has an insertion hole 53 for each electromagnetic valve 20 in the state in which the base member 51 and the cover member are integrated. The electromagnetic valve 20 is housed in the housing space 13 through the insertion hole 53.

The base member 51 is a plate-shaped member in which a principal portion 51a is formed into a plate shape (FIG. 10 and FIG. 11). The base member 51 is formed such that, when placed on the drive system arrangement portion 10A, the base member 51 can cover at least the periphery of the housing space 13 on one flat surface side. Thus, in the base member 51, a through hole 51b for exposing the housing space 13 when the base member 51 is placed is formed in the principal portion 51a. The through hole 51b serves as a part of the insertion hole 53 in the first housing member 50 on the oil pressure circuit body 10 side.

The base member 51 may be formed from any material, including a metal material and a synthetic resin material. The exemplified base member 51 is formed from an insulating material such as a synthetic resin material, and contains the first terminal 43A and the second terminal 43B therein such that one flat surface side thereof is exposed. In the present example, the first terminal 43A and the second terminal 43B are integrated with the base member 51 by insert molding.

As described above, the first electrical connection portions $42a_1$ of the electrical wires 42 are welded to the first terminal 43A and the second terminal 43B at one flat surface part exposed therefrom. Thus, in the first electrical connection structure 41A, the base member 51 serves as a wiring plate, and the first wiring portions 42a of the electrical wires 42 are wired on an inner wall surface of the base member 51. The base member 51 may be provided with a retaining portion configured to retain the wired first wiring portion 42a. In the present example, however, the path length of the first wiring portion 42a is short and the first electrical connection portions $42a_1$ are physically connected to the first terminal 43A and the second terminal 43B, and hence no retaining portion is provided.

The cover member 52 is assembled to the base member 51, and a principal portion 52a formed thereon so as to cover the base member 51 from the other flat surface side (FIG. 10 and FIG. 11). In the principal portion 52a, a through hole 52b for exposing the housing space 13 when the cover member 52 is assembled to the base member 51 and assembled to the drive system arrangement portion 10A. The through hole 52b serves as the insertion hole 53 together with the through hole 51b in the base member 51.

The cover member 52 may be formed from any material, including a metal material and a synthetic resin material. The exemplified cover member 52 is formed from an insulating material such as a synthetic resin material to suit the base member 51.

In the first housing member 50, locking mechanisms 54 configured to integrate the base member 51 and the cover member 52 are provided at a plurality of parts (FIG. 9 to FIG. 11). Each locking mechanism 54 has a first locking portion 54a provided to the principal portion 51a of the base member 51 and a second locking portion 54b that is provided to the principal portion 52a of the cover member 52 and configured to be locked with the first locking portion 54a to integrate the base member 51 and the cover member 52. For example, in the locking mechanism 54, one of the first locking portion 54a and the second locking portion 54b is formed as a claw portion, and the other of the first locking portion 54a and the second locking portion 54b is provided with a wall surface for hooking the claw portion thereon. In the present example, the first locking portion 54a is formed as a claw portion, and the second locking portion 54b is provided with a wall surface for hooking the claw portion thereon.

In the first housing member 50, the base member 51 and the cover member 52 are integrated in a manner that the first wiring portion 42a of each electrical wire 42 is first wired to the base member 51. At the wiring step, the end portion of the electrical wire 42 is cut such that the first wiring portion 42a has a design value. After that, the coating on the end portion of the first wiring portion 42a is peeled off to form the first electrical connection portion $42a_1$. In the present example, the cutting of the end portion and the peeling-off of the coating are performed after the electrical wire 42 is wired, and hence the shape of the base member 51 is formed, for example, by providing a cutout, such that a jig for the cutting and a jig for the peeling-off can be used.

At the next step, each first electrical connection portion $42a_1$ is welded to a corresponding terminal 43 (first terminal 43A or second terminal 43B). At the next step, the base member 51 and the cover member 52 are integrated together via the locking mechanism 54 while a part of the coupling member 81 in the movable portion 41C described later is sandwiched by the base member 51 and the cover member 52. The step for integrating the base member 51 and the cover member 52 together involves coupling of the first housing member 50 to the coupling member 81. The coupling structure is described later.

A physical and electrical connection part (hereinafter referred to simply as "connection part") between the first electrical connection portion $42a_1$ of the electrical wire 42 and a counterpart (the first terminal 43A or the second terminal 43B) may be covered with an insulating member similarly to a connection part between the second electrical connection portion $42b_1$ described later and a counterpart (terminal 31 in the control unit 30). In particular, in the case where the connection parts are arranged adjacent to each other and the interval between adjacent connection parts is narrow, it is desired to cover each connection part with an insulating member to prevent an electrical connection with conductive dust (contamination) in the operating oil. Thus, even when conductive dust is mixed in the operating oil and the operating oil flows into the inside of the connector module 40, the connector module 40 can maintain an electrical connection between electrical connection targets (between the electromagnetic valve 20 and the control unit 30) and improve the durability of the connector module 40 and the electrical connection targets. For example, in the first housing member 50, a rectangular parallelepiped shaped space portion (that is, a surrounded recess-shaped portion) 51d is formed by a U-shaped wall portion 51c of the base member 51 and a wall portion 81a of the coupling member 81 when the coupling member 81 is mounted to the base member 51 (FIG. 10). The wall portion 51c is provided upright so as to surround a welded part with the first electrical connection portion $42a_1$ in the exposed part of the terminal 43 (first terminal 43A or second terminal 43B). From another view point, the first electrical connection portion $42a_1$ and the terminal 43 are formed so as to be arranged in the space portion 51d and such that a physical and electrical connection part therebetween is housed in the space portion 51d. The wall portion 51c is provided upright for each connection part between the first electrical connection portion $42a_1$ and the counterpart (first terminal 43A or second terminal 43B). Specifically, the space portion 51d arranges a connection parts therein and is provided for each connection part. Thus, by pouring a liquid or gel insulating synthetic resin material into the space portion 51d and solidifying the synthetic resin material, an insulating member configured to cover the connection parts can be formed. The space portion 51d can prevent the poured synthetic resin material from flowing out.

The thus integrated first housing member 50 is fixed to the drive system arrangement portion 10A in the oil pressure circuit body 10 via screw members (not illustrated), for example. In the exemplified first housing member 50, through holes 55 through which male screw members are inserted are provided (FIG. 9 to FIG. 11). The through hole 55 is formed by a through hole 55a provided in the principal portion 51a of the base member 51 and a through hole 55b provided in the principal portion 52a of the cover member 52. Female screw portions (not illustrated) to be screwed with the male screw members are provided in the drive system arrangement portion 10A.

The first housing member 50 may have a connection structure for the electromagnetic valve 20 or does not need to have a connection structure for the electromagnetic valve 20. In the present example, a connection structure for the electromagnetic valve 20 is provided to each of the oil pressure circuit body 10 and the first housing member 50. Now, the connection structure for the electromagnetic valve 20 is briefly described.

The exemplified connection structure for the electromagnetic valve 20 includes at least two first connection structures 61 (FIG. 4 to FIG. 7), a second connection structure 62 (FIG. 4 to FIG. 7), and at least two third connection structures 63 (FIG. 6, FIG. 7, and FIG. 13) for each electromagnetic valve 20.

The first connection structure 61 includes a first tool to be connected 61A provided to the housing body 23 (FIG. 6 and FIG. 7), and a first connecting tool 61B that is provided to a wall portion forming the housing space 13 (inner circumferential wall portion 13b) and configured to lock the first tool to be connected 61A in the axial direction (axial direction of the housing space 13 and the housing body 23) when the housing body 23 is housed in the housing space 13 (FIG. 4 and FIG. 5). In the present example, the two first connection structures 61 are provided at substantially equal intervals around the axis.

The electromagnetic valve 20 is mounted to the oil pressure circuit body 10 in a manner that the housing body 23 is inserted into the housing space 13 along the axial direction of the central axis (central axis of the housing body 23) and after the distal end surface 23a of the housing body 23 abuts the bottom portion 13a in the housing space 13, the entire electromagnetic valve 20 is rotated about the central axis. Thus, the first tool to be connected 61A is formed as a protruding portion that partially protrudes from an outer circumferential wall portion of the housing body 23 toward the radially outer side. The first connecting tool 61B is formed as a groove portion that guides the first tool to be connected 61A in response to the housing operation of the housing body 23 into the housing space 13 and locks the first tool to be connected 61A in the axial direction (axial direction of the housing space 13 and the housing body 23) after the rotating operation of the electromagnetic valve 20 about the central axis (central axis of the housing body 23) in the housing operation of the housing body 23. For example, the first connecting tool 61B is formed into a groove shape in which a part of the wall portion (inner circumferential wall portion 13b) in the housing space 13 is recessed to the radially outer side.

Specifically, the first connecting tool 61B has an axial groove portion $61B_1$ and a circumferential groove portion $61B_2$. The axial groove portion $61B_1$ is a groove configured to guide the first tool to be connected 61A in the axial direction when the housing body 23 is inserted into the housing space 13 along the axial direction. The axial groove portion $61B_1$ extends from the outer wall surface side of the oil pressure circuit body 10 to the position of the bottom portion 13a in the housing space 13 along the axial direction.

The circumferential groove portion $61B_2$ is a groove configured to guide the first tool to be connected 61A in the circumferential direction when the housing body 23 is rotated in the housing space 13 about the central axis. The circumferential groove portion $61B_2$ extends from the bottom portion 13a side of the axial groove portion $61B_1$ in the circumferential direction. The circumferential groove portion $61B_2$ has side walls $61B_3$ opposed to the bottom portion 13a in the axial direction. The bottom portion 13a and the side walls $61B_3$ lock the relative movement of the first tool to be connected 61A in the axial direction. In this manner, the first connection structure 61 can suppress the movement of the electromagnetic valve 20 relative to the oil pressure circuit body 10 in the axial direction.

The second connection structure 62 includes a second tool to be connected 62A provided to the housing body 23 (FIG. 6 and FIG. 7), and a second connecting tool 62B that is provided to the wall portion (inner circumferential wall portion 13b) forming the housing space 13 and configured to suppress the relative movement of the second tool to be connected 62A along a plane orthogonal to the axial direction (axial direction of the housing space 13 and the housing body 23) when the housing body 23 is housed in the housing space 13 (FIG. 4 and FIG. 5).

For example, in the present example, an outer circumferential wall portion 23b of the first housing body 23A is used as the second tool to be connected 62A, and the inner circumferential wall portion 13b in the housing space 13 is used as the second connecting tool 62B. In the second connection structure 62 in this case, the outer circumferential wall portion 23b (second tool to be connected 62A) and the inner circumferential wall portion 13b (second connecting tool 62B) are formed to have the same outer diameter, and are fitted together under the state in which backlash is suppressed, thereby suppressing the relative movement between the housing body 23 and the housing space 13 in the direction orthogonal to the axial direction. In this manner, the second connection structure 62 can suppress the relative movement between the oil pressure circuit body 10 and the electromagnetic valve 20 in the direction orthogonal to the axial direction.

Figure 13:
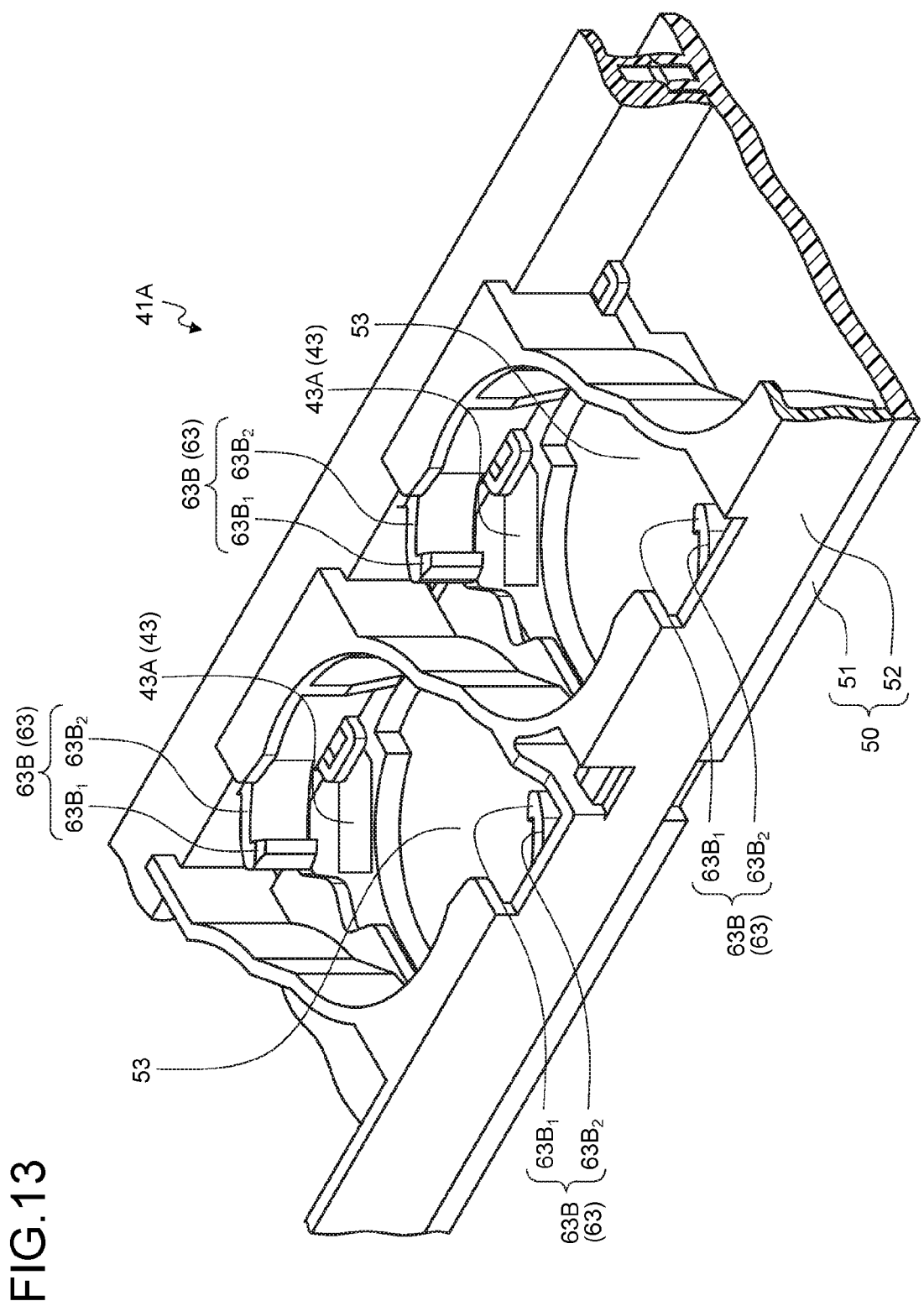
FIG. 13 is a perspective view of the first electrical connection structure, for describing the connection structure for the electromagnetic valve.

The third connection structure 63 includes a third tool to be connected 63A provided to the housing body 23 (FIG. 2, FIG. 6, and FIG. 7), and a third connecting tool 63B that is provided to the cover member 52 in the first housing member 50 and configured to lock the third tool to be connected 63A to suppress the rotation of the electromagnetic valve 20 relative to the oil pressure circuit body 10 about the central axis of the electromagnetic valve when the housing body 23 is housed in the housing space 13 (FIG. 2 and FIG. 13).

Specifically, the third tool to be connected 63A is formed as a protruding portion that partially protrudes from the outer circumferential wall portion in the housing body 23 to the radially outer side. The third connecting tool 63B is formed as a locking portion configured to lock the third tool to be connected 63A while being pushed by the third tool to be connected 63A along with the rotating operation of the housing body 23 described above, and stop the rotating operation. The third connecting tool 63B protrudes from a wall portion (inner wall portion) in the insertion hole 53 for the electromagnetic valve 20 to the radially inner side. Specifically, the third connecting tool 63B has a claw portion $63B_1$ over which the third tool to be connected 63A climbs while being pushed along with the rotating operation of the housing body 23, and a coupling portion $63B_2$ configured to couple the claw portion $63B_1$ to the wall portion (inner wall portion) in the insertion hole 53 (FIG. 13). It is desired that the coupling portion $63B_2$ be formed to have flexibility so as to apply a pressing force to the third tool to be connected 63A when the third tool to be connected 63A climbs over the claw portion $63B_1$ while pushing the claw portion $63B_1$. In this manner, the third connection structure 63 can suppress the movement of the electromagnetic valve 20 relative to the oil pressure circuit body 10 about the axis.

The electromagnetic valve 20 is mounted to the first electrical connection structure 41A and the oil pressure circuit body 10 with the first connection structures 61, the second connection structure 62, and the third connection structures 63. When the electromagnetic valve 20 is rotated relative to the oil pressure circuit body 10 about the axis at the mounting step, the valve-side contact 24a of each terminal 24 abuts a corresponding terminal 43 (first terminal 43A or second terminal 43B). In the connector module 40, a physical and electrical connection between the electromagnetic valve 20 and the terminal 43 is established in this manner.

Figure 14:
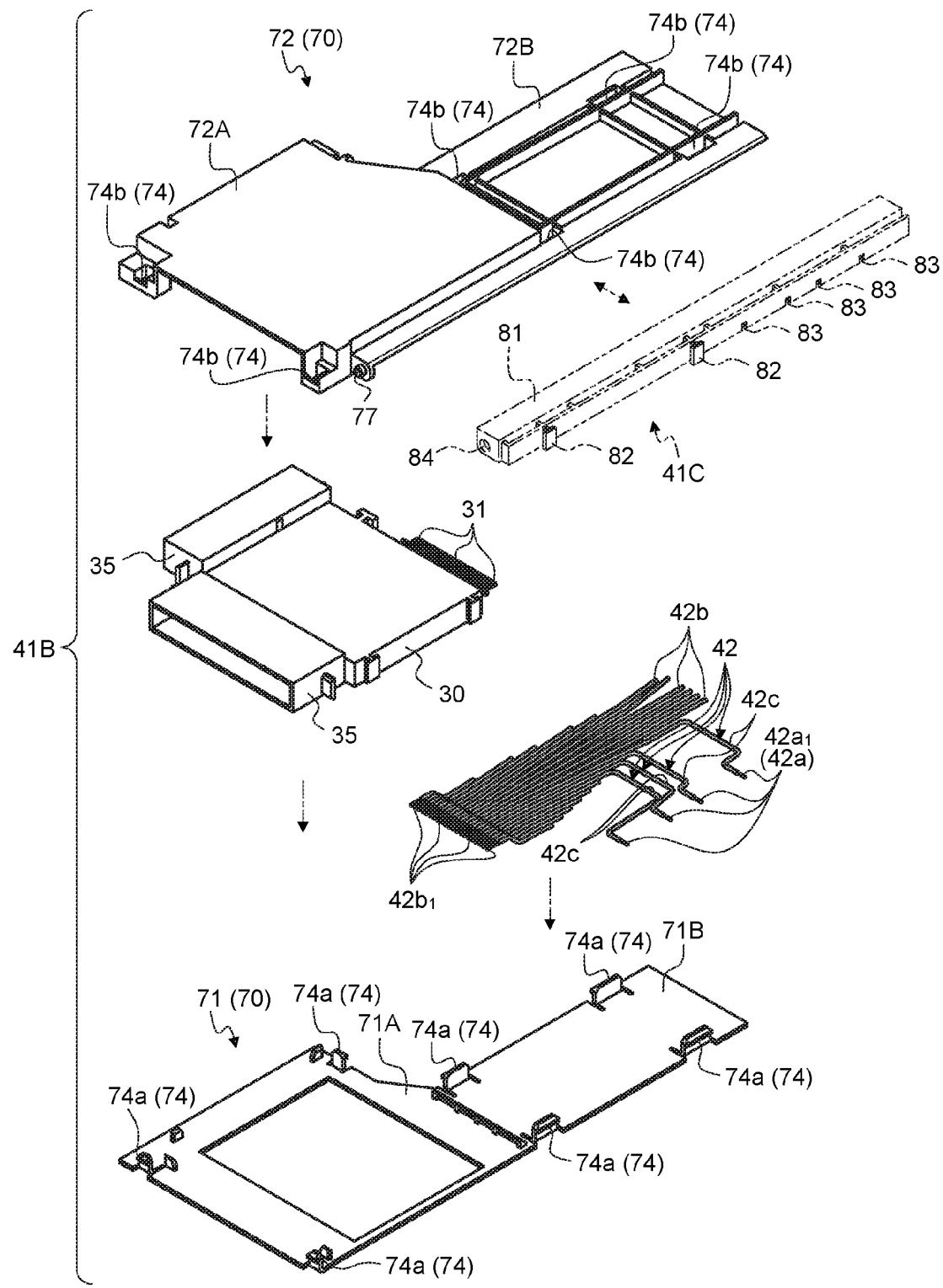
FIG. 14 is an exploded perspective view of a second electrical connection structure.

Next, the second electrical connection structure 41B is described. In the exemplified second electrical connection structure 41B, all components are formed from a material resistant to properties of the operating oil for the same reason as for the coating of the electrical wire 42. In the exemplified second electrical connection structure 41B, as described above, the second wiring portion 42b and the second electrical connection portion $42b_1$ of the electrical wire 42 are arranged. The second electrical connection structure 41B is provided with a second housing member 70 configured to house the second wiring portion 42b and the second electrical connection portion $42b_1$ therein (FIG. 14). The second housing member 70 is mounted to the control system arrangement portion 10B in the oil pressure circuit body 10. The exemplified second housing member 70 is roughly divided into a base member 71 and a cover member 72. The second housing member 70 is provided with a housing chamber for the control unit 30.

The base member 71 is a plate-shaped member formed into a plate shape, and is placed on the control system arrangement portion 10B from one flat surface side. The base member 71 is roughly divided into a first housing portion 71A that serves as a part of the housing chamber for the control unit 30 and a second housing portion 71B that serves as a part of a housing chamber for the second wiring portion 42b. The first housing portion 71A and the second housing portion 71B may be an integrated member or separate members. The exemplified base member 71 is an integrally molded article of the first housing portion 71A and the second housing portion 71B. The base member 71 is formed from an insulating material such as a synthetic resin material.

The cover member 72 is assembled to the base member 71, and is formed so as to cover the base member 71 from the other flat surface side. The exemplified cover member 72 serves as a wiring plate on which the second wiring portions 42b are wired, and is formed from an insulating material such as a synthetic resin material. The cover member 72 is roughly divided into a first housing portion 72A that serves as a part of the housing chamber for the control unit 30 and a second housing portion 72B that serves as a part of the housing chamber for the second wiring portion 42b. The first housing portion 72A and the second housing portion 72B may be an integrated member or separate members. The exemplified cover member 72 has separate members as described later, and is formed of a first cover member (hereinafter referred to as "first cover member 72A") serving as the first housing portion 72A and a second cover member (hereinafter referred to as "second cover member 72B") serving as the second housing portion 72B. In the cover member 72, the first cover member 72A covers the first housing portion 71A in the base member 71 to form an internal space, and the internal space is used as the housing chamber for the control unit 30. In the cover member 72, the second cover member 72B covers the second housing portion 71B in the base member 71 to form an internal space, and the internal space is used as the housing chamber for the second wiring portion 42b.

Figure 15:
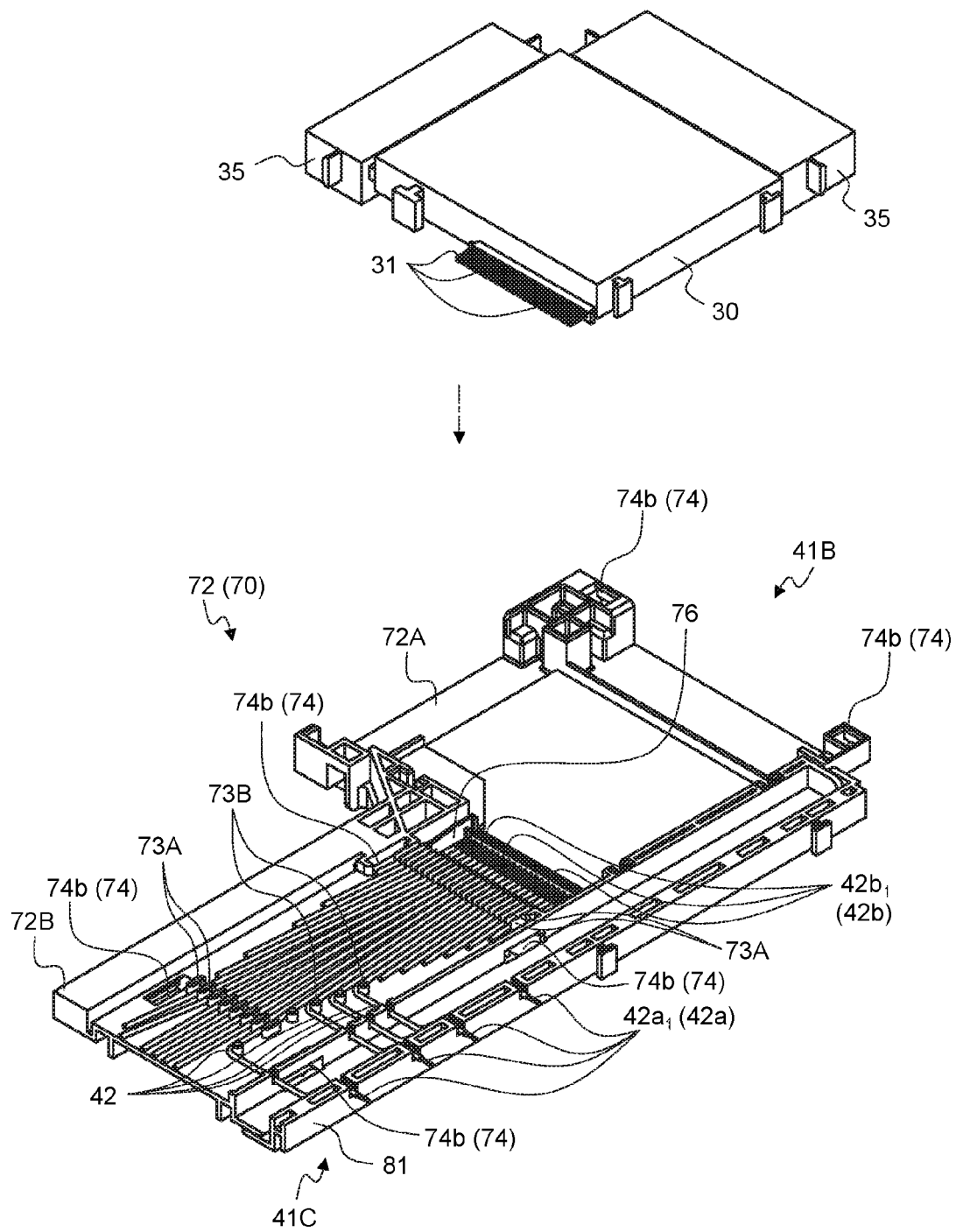
FIG. 15 is a perspective view illustrating the internal structure of the second electrical connection structure.
Figure 16:
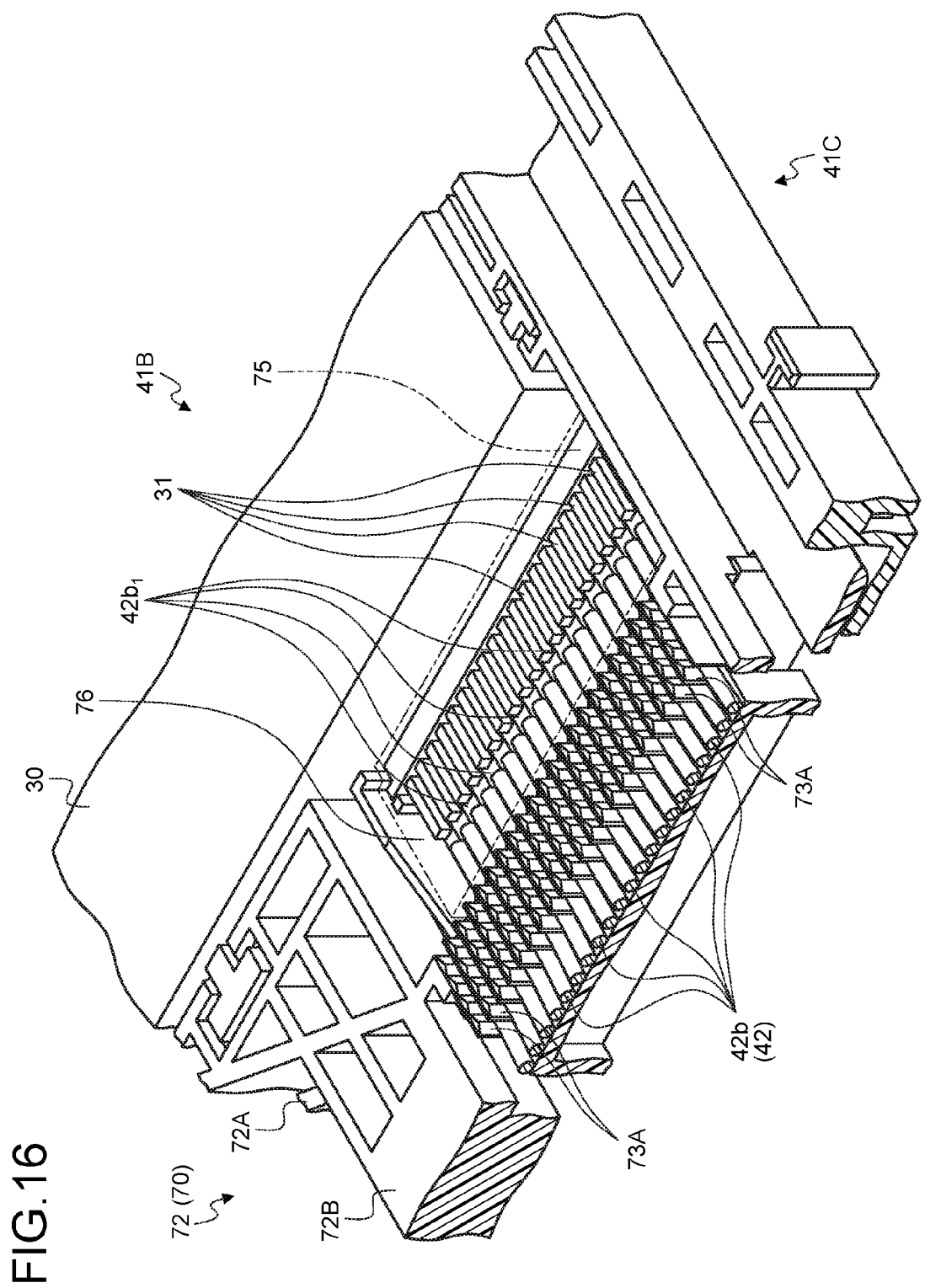
FIG. 16 is a view for describing an insulating member in the second electrical connection structure.
Figure 17:
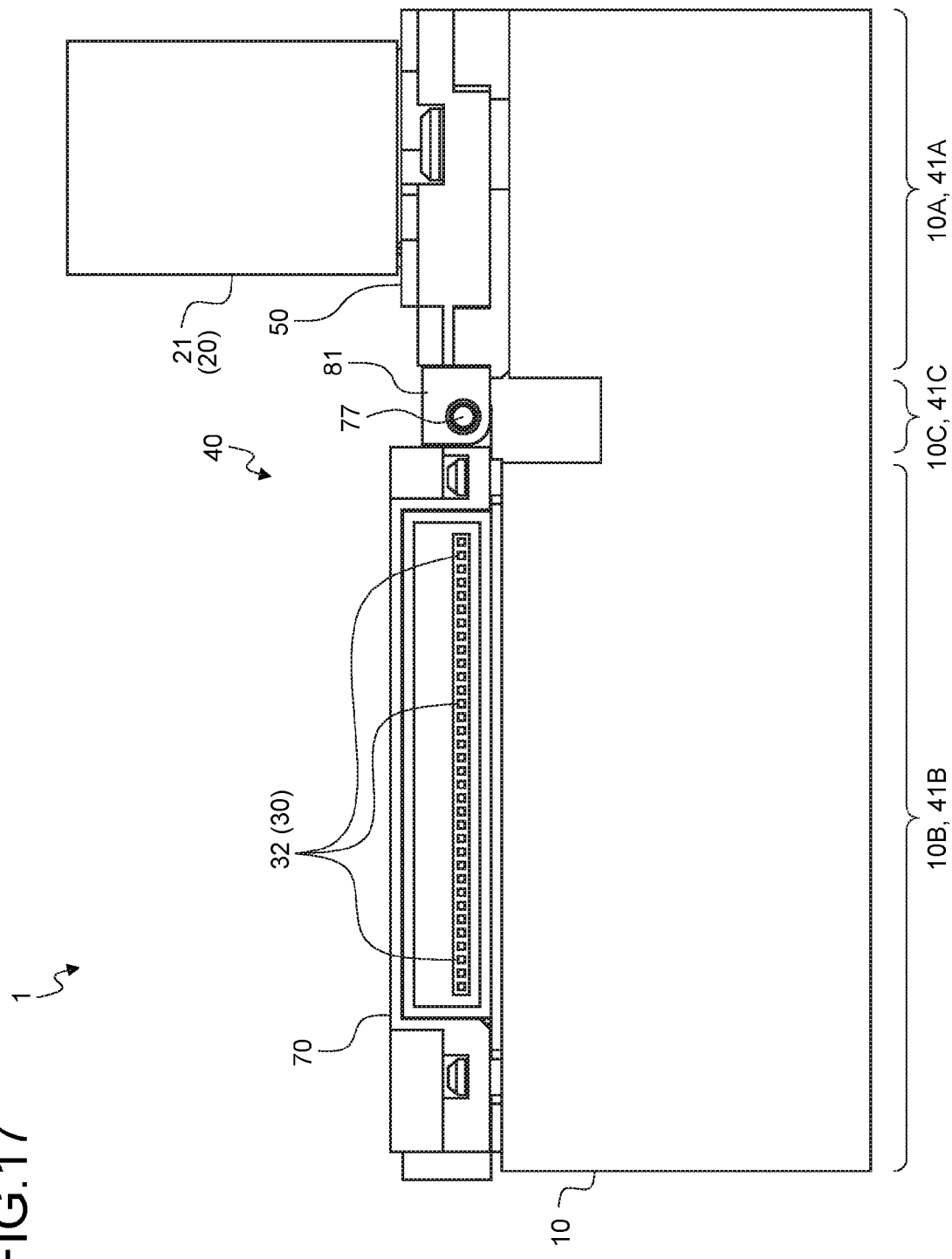
FIG. 17 is a view illustrating one application example of the connector module for an oil pressure circuit body (hydraulic pressure circuit body)
Figure 18:
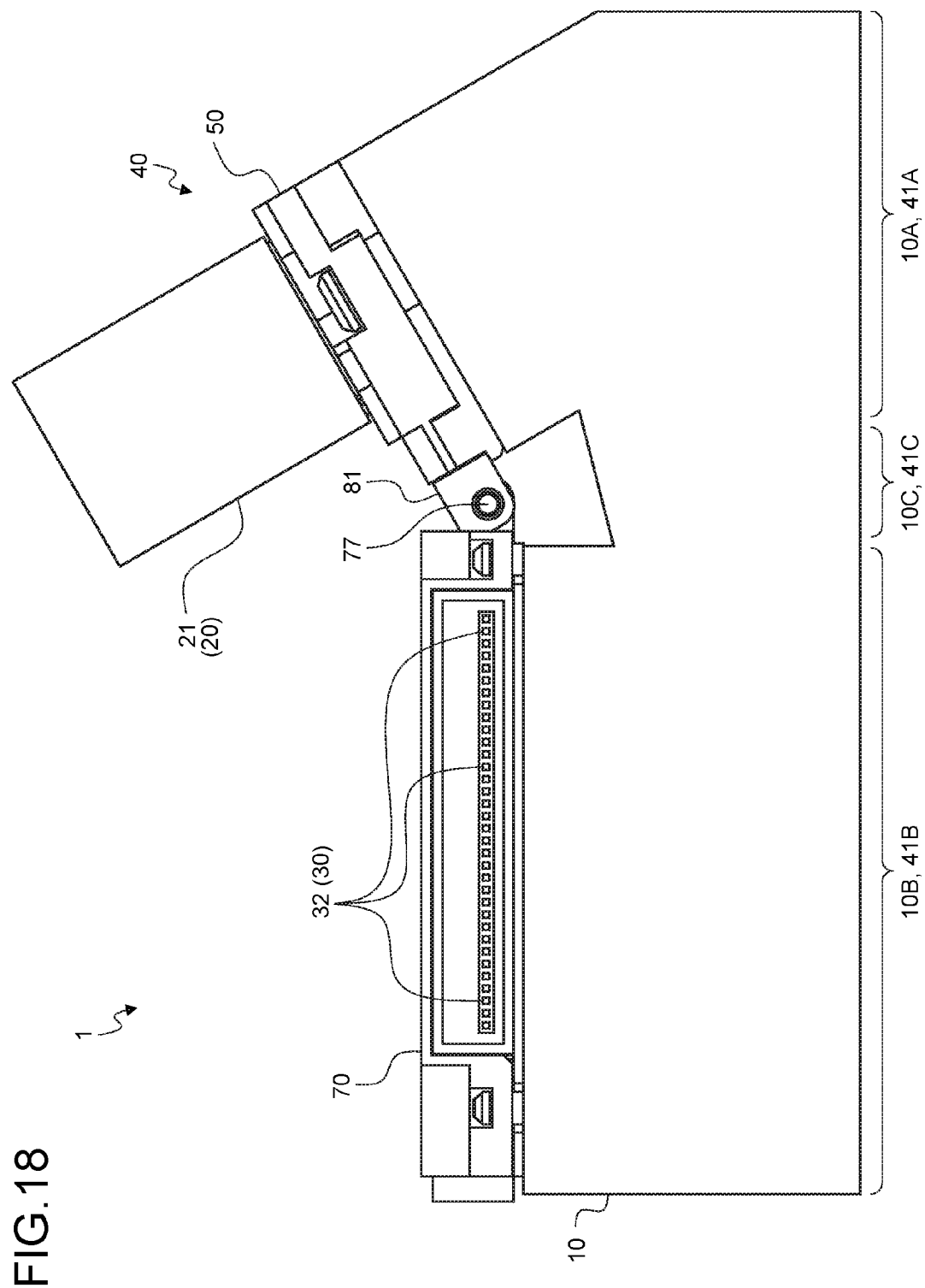
FIG. 18 is a view illustrating another application example of the connector module for the oil pressure circuit body (hydraulic pressure circuit body)
Figure 19:
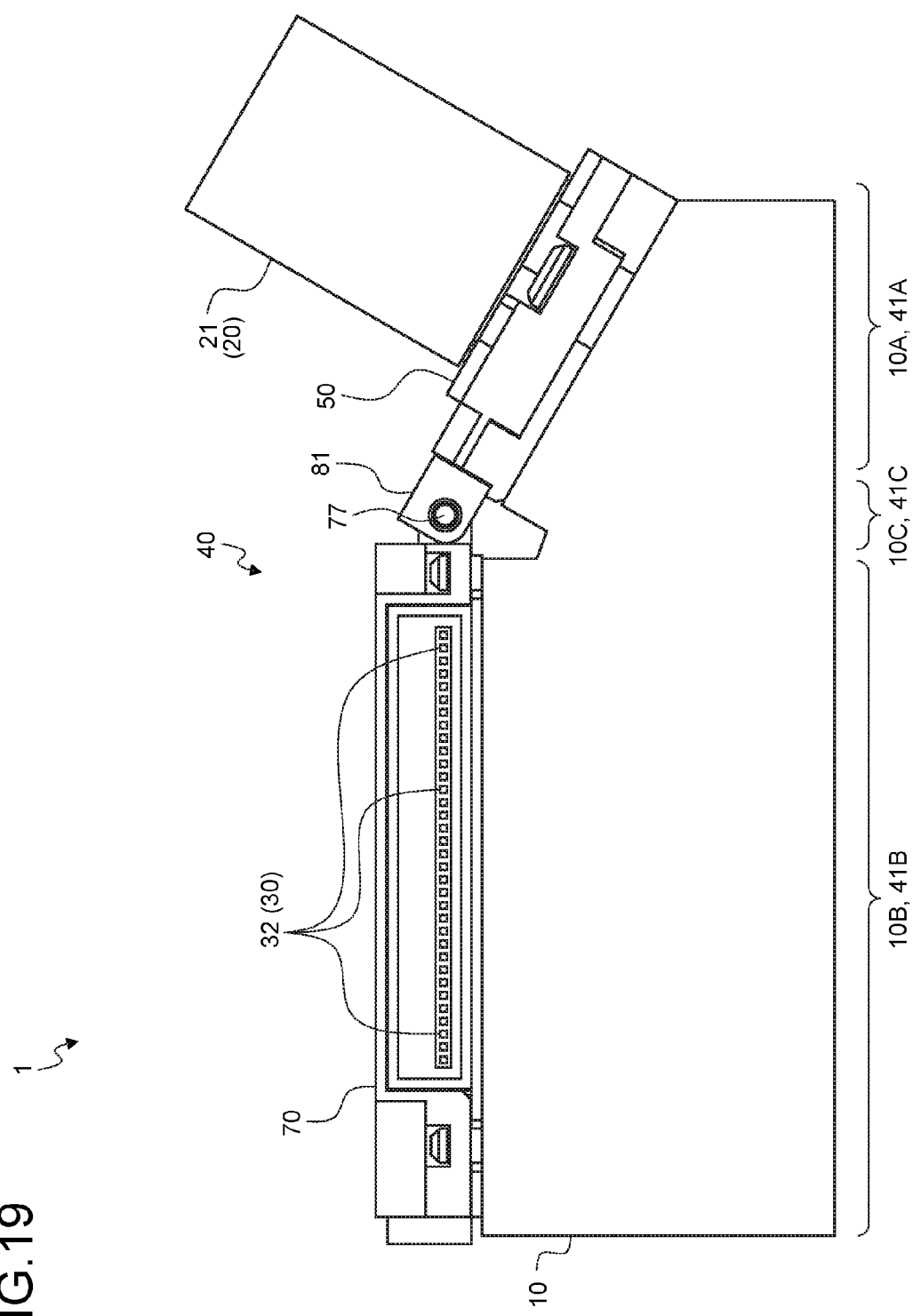
FIG. 19 is a view illustrating another application example of the connector module for the oil pressure circuit body (hydraulic pressure circuit body)
Figure 20:
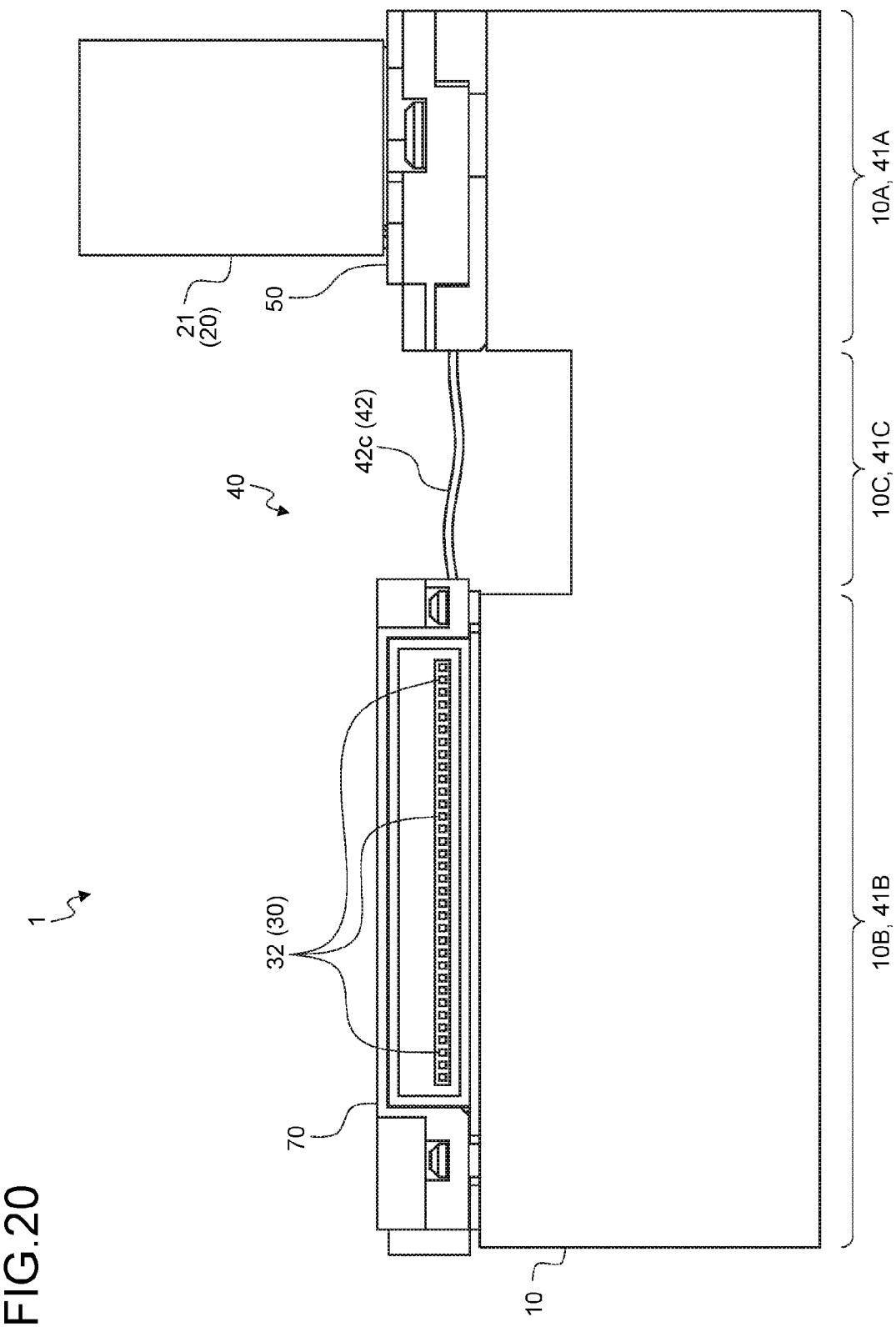
FIG. 20 is a view illustrating another application example of the connector module for the oil pressure circuit body (hydraulic pressure circuit body)

In the housing chamber for the second wiring portion 42b, the second wiring portions 42b are wired on an inner wall surface of the second cover member 72B (FIG. 15). The inner wall surface of the second cover member 72B is provided with retaining portions 73A configured to retain the second wiring portions 42b one by one and bending guide portions 73B configured to regulate folded parts of the second wiring portions 42b. For example, the retaining portion 73A is an upright member configured to retain the second wiring portion 42b by sandwiching the second wiring portion 42b with another retaining portion 73A. The retaining portion 73A is provided at one or a plurality of locations in accordance with the path length of the second wiring portion 42b (FIG. 15 and FIG. 16). For example, the bending guide portion 73B is a columnar member provided upright at a folded part of the second wiring portion 42b. The bending guide portion 73B guides the second wiring portion 42b while folding the second wiring portion 42b along the circumferential direction thereof.

In the second housing member 70, locking mechanisms 74 configured to integrate the base member 71 and the cover member 72 together are provided at a plurality of locations (FIG. 14 and FIG. 15). Each locking mechanism 74 has a first locking portion 74a provided to the base member 71, and a second locking portion 74b that is provided to the cover member 72 and configured to be locked with the first locking portion 74a to integrate the base member 71 and the cover member 72 together. The exemplified locking mechanism 74 is similar to the locking mechanism 54 in the first housing member 50. The first locking portion 74a is formed as a claw portion, and the second locking portion 74b is provided with a wall surface for hooking the claw portion thereon.

In the second electrical connection structure 41B, the second electrical connection portion $42b_1$ is directly and electrically connected to the control unit 30. In the present example, one second electrical connection portion $42b_1$ is provided for each terminal 31 for the control unit 30. The terminal 31 serves as a counterpart electrical connection portion for the second electrical connection portion $42b_1$.

In integrating the base member 71 and the cover member 72 together in the second housing member 70, the second wiring portion 42b of each electrical wire 42 is wired on the second cover member 72B along the retaining portion 73A and the bending guide portion 73B described above. At the wiring step, the end portion of the electrical wire 42 is cut such that the length of the second wiring portion 42b has a design value. After that, the coating on the end portion of the second wiring portion 42b is peeled off to form the second electrical connection portion $42b_1$. In the present example, the cutting of the end portion and the peeling-off of the coating are performed after the electrical wire 42 is wired, and hence the shape of the second cover member 72B is formed, for example, by providing a cutout, such that a jig for the cutting and a jig for the peeling-off can be used.

At the next step, the control unit 30 is placed on the first cover member 72A (in this case, a connector 35 for the control unit 30 may be already mounted to the control unit 30 or mounted at a subsequent step), and then the second electrical connection portion $42b_1$ and the terminal 31 for the control unit 30 are welded (FIG. 16). Substantially the whole of the second electrical connection portion $42b_1$ and the terminal 31 welded and exposed is a physical and electrical connection part. At the next step, the base member 71 and the cover member 72 are integrated via the locking mechanisms 74.

In the connector module 40, the pitches of adjacent connection parts in the second electrical connection structure 41B are narrow. An automatic transmission operating oil mixed with conductive dust (what is called contamination) such as metal powder can possibly flow into the inside of the connector module 40. To address this, in the connector module 40, each connection part is covered with an insulating member 75 to prevent an electrical connection between the connection part and dust. Consequently, even when conductive dust is mixed in the operating oil and the operating oil flows into the inside of the connector module 40, the connector module 40 can maintain an electrical connection between electrical connection targets (between the electromagnetic valve 20 and the control unit 30) and improve the durability of the connector module 40 and the electrical connection targets.

For example, in the connector module 40, a liquid or gel insulating synthetic resin material is poured into all connection parts and their surroundings and solidified such that the connection parts are each covered with the insulating member 75. In this case, a recess-shaped portion 76 is formed on the inner wall surface side of the first cover member 72A as illustrated in FIG. 16 in order to prevent the synthetic resin material from flowing out before being solidified. The recess-shaped portion 76 is a surrounded recess portion. The exemplified recess-shaped portion 76 is formed so as to be recessed from the inner wall surface (wiring surface) of the second cover member 72B on which the second wiring portion 42b of the electrical wire 42 is wired. All connection parts are housed in the recess-shaped portion 76. For establishing such a housing state, the second electrical connection portion $42b_1$ and the terminal 31 are formed so as to be arranged in the recess-shaped portion 76 and such that a physical and electrical connection part of the second electrical connection portion $42b_1$ and the terminal 31 is housed in the recess-shaped portion 76. In the present example, the second electrical connection portion $42b_1$ is folded and offset, for example, in a stepped manner with respect to the second wiring portion 42b such that the second electrical connection portion $42b_1$ is arranged in the recess-shaped portion 76. Accordingly, in the connector module 40, the connection parts are formed inside the recess-shaped portion 76, and hence when the synthetic resin material is poured into the recess-shaped portion 76, the connection parts are covered with the insulating member 75 while being separated from one another. As described above, in the connector module 40, the insulating member 75 is formed inside the recess-shaped portion 76, and hence the insulating property between all adjacent connection parts can be secured.

The offset shape of the second wiring portion 42b may be formed before wiring of the second wiring portion 42b or after the wiring. For example, the second wiring portion 42b is wired on the second cover member 72B such that the length on the second electrical connection portion $42b_1$ side is larger than a design value, and is sent to the next pressing step. At the pressing step, a press machine is used to push the second wiring portion 42b on the second electrical connection portion $42b_1$ side into the recess-shaped portion 76 to form the offset shape of the second wiring portion 42b. The pressing step may involve cutting the second wiring portion 42b on the second electrical connection portion $42b_1$ to the length of a design value at the same time as the formation of the offset shape. In this case, after the length on the second electrical connection portion $42b_1$ side is adjusted to a design value, at the next step, the coating on the end portion of the second wiring portion 42b is peeled off to form the second electrical connection portion $42b_1$.

The description in the present example assumes that all connection parts are arranged inside the rectangular parallelepiped shaped insulating member 75 while being separated from one another with gaps. However, the insulating member 75 may cover the connection parts individually. In the connector module 40, an insulating member serving as a wall may be arranged between adjacent connection parts.

Next, the movable portion 41C is described. The movable portion 41C is provided with the coupling member 81 configured to couple the first electrical connection structure 41A and the second electrical connection structure 41B arranged adjacent to each other. The coupling member 81 couples the first electrical connection structure 41A and the second electrical connection structure 41B such that the relative positional relation therebetween can be changed.

Specifically, the coupling member 81 is provided to extend along a gap between the first electrical connection structure 41A and the second electrical connection structure 41B adjacent to each other (FIG. 1 to FIG. 3, FIG. 8, and FIG. 9). For example, the coupling member 81 is formed from a material (such as a synthetic resin) that is resistant to properties of the operating oil and has insulating property for the same reason as for the coating of the electrical wire 42.

The coupling structure for the first electrical connection structure 41A is described. In the coupling member 81, a coupling portion 82 for the first housing member 50 is provided on the wall portion 81a opposed to the first housing member 50 (FIG. 9 to FIG. 11). The exemplified coupling portion 82 is a protruding portion that is formed into a T-shape with a rectangular first piece 82a that protrudes from the wall portion 81a toward the first housing member 50 and a second piece 82b provided at a free end of the first piece 82a (FIG. 10).

The first housing member 50 is provided with a locking member 56 configured to house and lock the coupling portion 82 therein (FIG. 10 to FIG. 12). The locking member 56 has, for example, a cutout through which the first piece 82a of the coupling portion 82 is inserted and an inner space for housing and locking the second piece 82b of the coupling portion 82 therein. In the present example, the locking member 56 is divided into a first locking portion 56a on the base member 51 side and a second locking portion 56b on the cover member 52 side such that the locking member 56 is formed when the base member 51 and the cover member 52 are assembled together. The first locking portion 56a and the second locking portion 56b each house and lock the T-shaped coupling portion 82 on halves, and have a cutout through which a half of the first piece 82a is inserted and an inner space for housing and locking a half of the second piece 82b therein.

In the first electrical connection structure 41A, at the assembly step for the base member 51 and the cover member 52, when the T-shaped coupling portion 82 is housed in the first locking portion 56a and the second locking portion 56b, and the locking member 56 is formed at the same time as the completion of the assembly of the base member 51 and the cover member 52, the coupling portion 82 is housed and locked into the locking member 56. The first electrical connection structure 41A and the coupling member 81 coupled in this manner can move relative to each other due to backlash corresponding to play between the locking member 56 and the coupling portion 82. Basically, however, the relative positional relation between the first electrical connection structure 41A and the coupling member 81 is maintained constant.

In the coupling member 81, a cutout 83 through which the first wiring portion 42a is inserted is provided for each first wiring portion 42a in order to prevent the first wiring portion 42a from being bitten between the coupling member 81 and the base member 51 (FIG. 10).

Subsequently, the coupling structure for the second electrical connection structure 41B is described. In the present example, the second electrical connection structure 41B is rotated relative to the coupling member 81, thereby allowing for the relative rotation between the first electrical connection structure 41A and the second electrical connection structure 41B. To achieve this feature, a rotary shaft is provided to one of the second housing member 70 in the second electrical connection structure 41B and the coupling member 81 in the movable portion 41C, and a bearing portion for the rotary shaft is provided to the other. In the present example, a rotary shaft 77 is provided to the second cover member 72B in the second housing member 70, and a bearing portion 84 is provided to the coupling member 81 (FIG. 14). The rotary shafts 77 are each a columnar member protruding from the second cover member 72B, and are arranged at two concentric locations (only one location is illustrated in FIG. 14). After being mounted to the oil pressure circuit body 10, the connector module 40 does not need to move relatively between the first electrical connection structure 41A and the second electrical connection structure 41B. Thus, the bearing portion 84 is provided for each rotary shaft 77 as a through hole through which the rotary shaft 77 is inserted so as to be freely rotatable.

For example, in the case where the connector module 40 includes electrical wires 42 individually for the first electrical connection structure 41A and the second electrical connection structure 41B, the electrical wire 42 for the first electrical connection structure 41A has the first wiring portion 42a and the first electrical connection portion $42a_1$, and the electrical wire 42 for the second electrical connection structure 41B has the second wiring portion 42b and the second electrical connection portion $42b_1$. In this case, as described above, a connection body of the first electrical connection structure 41A and the coupling member 81 is formed and further the second electrical connection structure 41B is formed, and the second electrical connection structure 41B and the coupling member 81 are assembled together via the rotary shaft 77 and the bearing portion 84. In this case, a free end of the electrical wire 42 for the first electrical connection structure 41A (end portion on the opposite side of the first electrical connection portion $42a_1$) and a free end of the electrical wire 42 for the second electrical connection structure 41B (end portion on the opposite side of the second electrical connection portion $42b_1$) are physically and electrically connected by welding or by using terminals.

In the connector module 40, however, the electrical wires 42 cross the first electrical connection structure 41A and the second electrical connection structure 41B. Thus, for example, in the present example, the coupling member 81 is assembled to the second electrical connection structure 41B after the second electrical connection structure 41B is formed. Each electrical wire 42 that protrudes from the connection body of the second electrical connection structure 41B and the coupling member 81 is wired on the base member 51 on the first electrical connection structure 41A side to form the first wiring portion 42a and the first electrical connection portion $42a_1$. After that, in the present example, the coupling member 81 is mounted to the first housing member 50 while the base member 51 and the cover member 52 are integrated. The connector module 40 may be formed in this manner.

In the connector module 40 formed in the manner as described above, the first wiring portion 42a and the second wiring portion 42b are wired in the first housing member 50 and the second housing member 70, respectively, and hence a tolerance variation in the first housing member 50 and the second housing member 70 can be absorbed to arrange the first wiring portion 42a (first electrical connection portion $42a_1$) and the second wiring portion 42b (second electrical connection portion $42b_1$) at desired positions. The connector module 40 can thus improve the connection workability and connection accuracy (in other words, accuracy of energization) between the first electrical connection portion $42a_1$ and the terminal 43 and improve the connection workability and connection accuracy between the second electrical connection portion $42b_1$ and the terminal 31. The connector module 40 can reduce the cost from this point of view as well. In the case where a rigid member (such as a bus bar or a rigid substrate) is used instead of the electrical wires 42, a highly accurate rigid member with a reduced tolerance variation needs to be formed and arranged in order to secure the connection accuracy between the rigid member and the terminal 31 and between the rigid member and the terminal 43, which may increase the cost. The connector module 40, however, uses the electrical wires 42 and can thus reduce the cost.

The connector module 40 includes the movable portion 41C between the first electrical connection structure 41A and the second electrical connection structure 41B, and the electrical wires 42 (coupling portions 42c as movable electrical wire portions) are arranged in the movable portion 41C, and hence the relative positional relation between the first electrical connection structure 41A and the second electrical connection structure 41B with the movable portion 41C as the boundary can be changed. The connector module 40 can thus allow the first electrical connection structure 41A and the second electrical connection structure 41B to be mounted to the drive system arrangement portion 10A and the control system arrangement portion 10B in the oil pressure circuit body 10, respectively, regardless of a change in the relative positional relation caused by a tolerance variation between the drive system arrangement portion 10A and the control system arrangement portion 10B. Consequently, the connector module 40 can improve the assembly workability and assembly accuracy for the oil pressure circuit body 10 as compared with the case where a rigid member (such as a bus bar or a rigid substrate) is used instead of the electrical wires 42. The connector module 40 can reduce the cost from this point of view as well. In the case where the connector module 40 needs to have high following capability to the change in the relative positional relation caused by a tolerance variation between the drive system arrangement portion 10A and the control system arrangement portion 10B, for example, the coupling member 81 may be omitted or large backlash may be provided between the coupling member 81 and the first electrical connection structure 41A and between the coupling member 81 and the second electrical connection structure 41B to increase the amount of change in the relative positional relation between the first electrical connection structure 41A and the second electrical connection structure 41B (in particular, the amount of change in a direction different from the direction of relative rotation).

After the assembly, a force acting on the first electrical connection structure 41A and the second electrical connection structure 41B (for example, a force generated due to thermal contraction or thermal expansion by heat of the operating oil or a force physically applied from the outside) can be absorbed by the movable portion 41C. The connector module 40 can thus improve the durability as compared with the case where a rigid member is used instead of the electrical wires 42.

Even when the mounting surface of the drive system arrangement portion 10A for the first electrical connection structure 41A and the mounting surface of the control system arrangement portion 10B for the second electrical connection structure 41B are arranged substantially flush with each other (FIG. 17) or when an angle is provided between the mounting surfaces (FIG. 18 and FIG. 19), the connector module 40 can be mounted to the oil pressure circuit body 10 in either case by adjusting the angle formed by the first electrical connection structure 41A and the second electrical connection structure 41B to be the same as the angle formed by the mounting surfaces as long as there is no change in the shapes of the drive system arrangement portion 10A and the control system arrangement portion 10B (that is, there is no circuit change in the oil pressure circuit body 10) and there is no large change in the gap between the drive system arrangement portion 10A and the control system arrangement portion 10B (in other words, the size of the coupling portion 10C). The connector module 40 can thus be shared among such different oil pressure circuit bodies 10. The connector module 40 can reduce the cost from this point of view as well. In the case where the angle formed by the mounting surfaces is acute, if the path length of the coupling portion 42c serving as a movable electrical wire portion is insufficient, the path length can be extended such that the first electrical connection structure 41A and the second electrical connection structure 41B are mounted on the respective mounting surfaces.

When there is no change in the shapes of the drive system arrangement portion 10A and the control system arrangement portion 10B but there is a large change in the gap therebetween (FIG. 20), for example, the connector module 40 can be mounted to the oil pressure circuit bodies 10 having different gaps by wiring the first wiring portion 42a and the second wiring portion 42b around the coupling portion 42c serving as a movable electrical wire portion such that the path length of the coupling portion 42c is extended or reduced. By simply changing the length of the electrical wire 42, the connector module 40 for each oil pressure circuit body 10 having a different gap can be formed. The connector module 40 can thus reduce the cost from this point of view as well. By setting the path length of the coupling portion 42c in accordance with the largest gap between the drive system arrangement portion 10A and the control system arrangement portion 10B, the connector module 40 can be shared among the oil pressure circuit bodies 10 having different gaps in this range. The connector module 40 can reduce the cost from this point of view. In these connector modules 40, the coupling member 81 may be provided to the movable portion 41C, but the coupling member 81 does not need to be provided to the movable portion 41C unless the durability of the coupling portion 42c is decreased.

Even when there is a change in the shapes of the drive system arrangement portion 10A and the control system arrangement portion 10B (that is, there is a circuit change in the oil pressure circuit body 10), the connector module 40 can respond to the oil pressure circuit body 10 after the circuit change by mainly changing the wiring path of the electrical wire 42. Specifically, by changing a part of the components in the connector module 40 so as to be suited to the oil pressure circuit body 10 after the circuit change, the connector module 40 can respond to this oil pressure circuit body 10. The connector module 40 can thus reduce the cost as compared with the case where a rigid member, which requires all components to be reformed, or a wire harness is used.

The connector module 40 can be formed by using various kinds of facility equipment, such as a wiring machine. The connector module 40 can thus eliminate or reduce manual work of an operator as compared with the conventional case where the electromagnetic valve 20 and the control unit 30 are manually connected with a wire harness. This effect can be applied even when the electrical wire 42 is replaced with a rigid member. The reason is that the use of a rigid member requires a work space for an adsorption machine for adsorbing and arranging the rigid member, and if the work space cannot be secured, the rigid member needs to be manually arranged. From these points of view, the connector module 40 can obtain satisfactory productivity and thus reduce the cost. The connector module 40 uses the electrical wires 42 coated as described above, and hence only countermeasures for an operating oil (such as providing the insulating member 75) need to be taken at a connection part (welded part) with a counterpart. From this point of view as well, the connector module 40 can obtain satisfactory productivity and thus reduce the cost. The use of a wire harness, which has an electrical wire bundle, may increase the physical size more than the use of the connector module 40.

In the connector module 40, the recess-shaped portion 76 configured to house the connection parts therein. Even when an insulating synthetic resin material as a raw material for the insulating member 75 is poured into the recess-shaped portion 76, the outflow of the synthetic resin material to the outside can be suppressed. Thus, in the connector module 40, the insulating member 75 can be formed inside the recess-shaped portion 76, and hence a simple production method can be used to cover the connection parts with the insulating member 75 and secure the insulating property of the connection parts. The connector module 40 can thus reduce the cost while obtaining satisfactory productivity and durability.

The connector module 40 can reduce the cost as compared with the use of an expensive flexible printed wiring board.

As described above, the connector module 40 in the present embodiment can reduce the cost while obtaining satisfactory productivity and durability. The hydraulic pressure control device (oil pressure control device 1) in the present embodiment includes such a connector module 40, and can thus obtain the same effects.

The above description has been given that the connector module 40 in the present embodiment is applicable to an oil pressure circuit body 10 in which the mounting surface of the drive system arrangement portion 10A for the first electrical connection structure 41A and the mounting surface of the control system arrangement portion 10B for the second electrical connection structure 41B are substantially flush with each other and an oil pressure circuit body 10 in which an angle (regardless of the magnitude) is provided between the mounting surfaces. The connector module 40 is, however, applicable also to an oil pressure circuit body 10 having another configuration.

Figure 21:
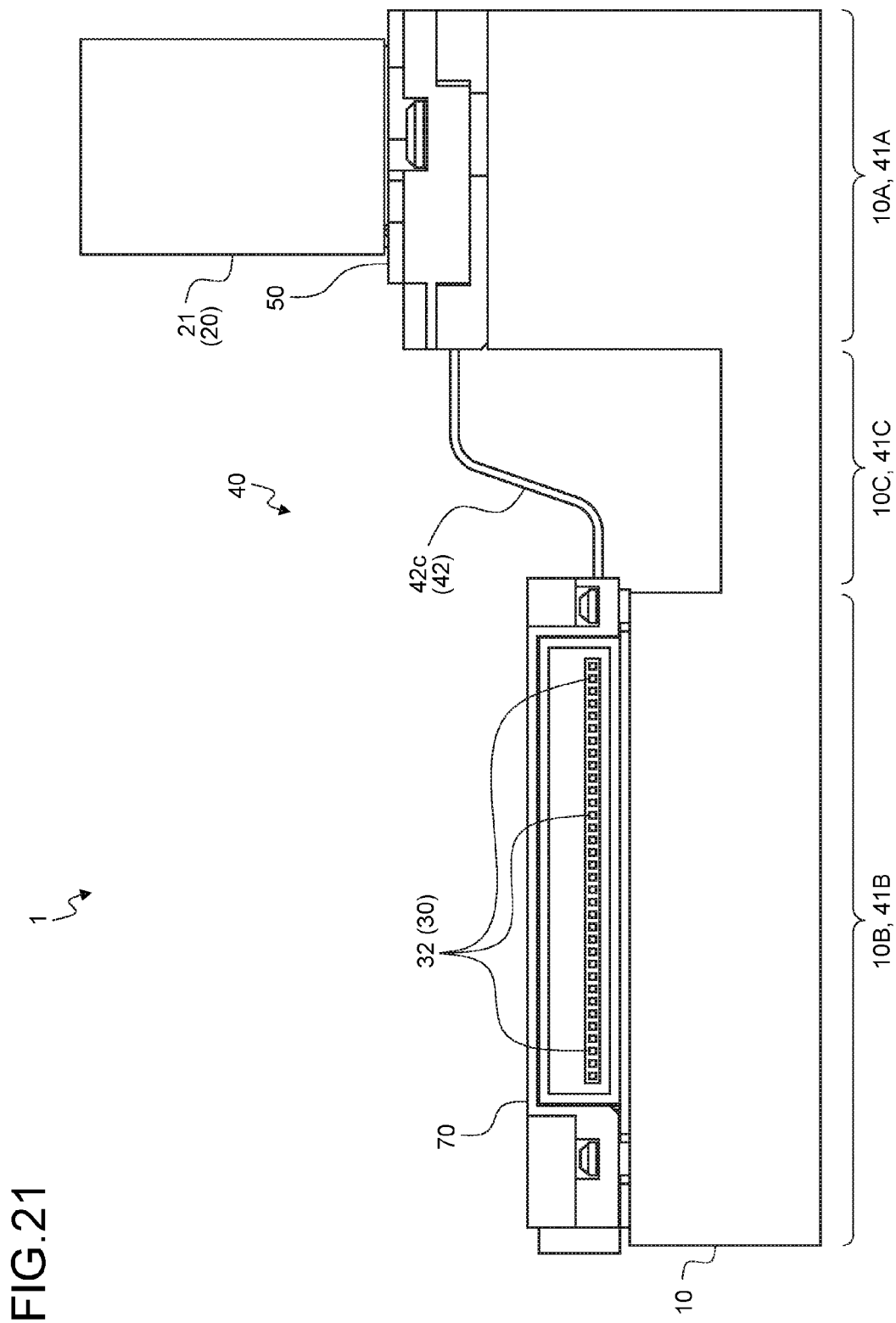
FIG. 21 is a view illustrating another application example of the connector module for the oil pressure circuit body (hydraulic pressure circuit body)

For example, in an oil pressure circuit body 10 illustrated in FIG. 21, a step is provided between a mounting surface of the first electrical connection structure 41A in the drive system arrangement portion 10A and a mounting surface of the second electrical connection structure 41B in the control system arrangement portion 10B. In this case, the mounting surface on the control system arrangement portion 10B side is lower in height than the mounting surface on the drive system arrangement portion 10A side. The connector module 40 can be mounted to such an oil pressure circuit body 10 by setting the path length of the coupling portion 42c of the electrical wire 42 so that the coupling portion 42c can connect the first electrical connection structure 41A and the second electrical connection structure 41B mounted on the respective mounting surfaces to each other.

Figure 22:
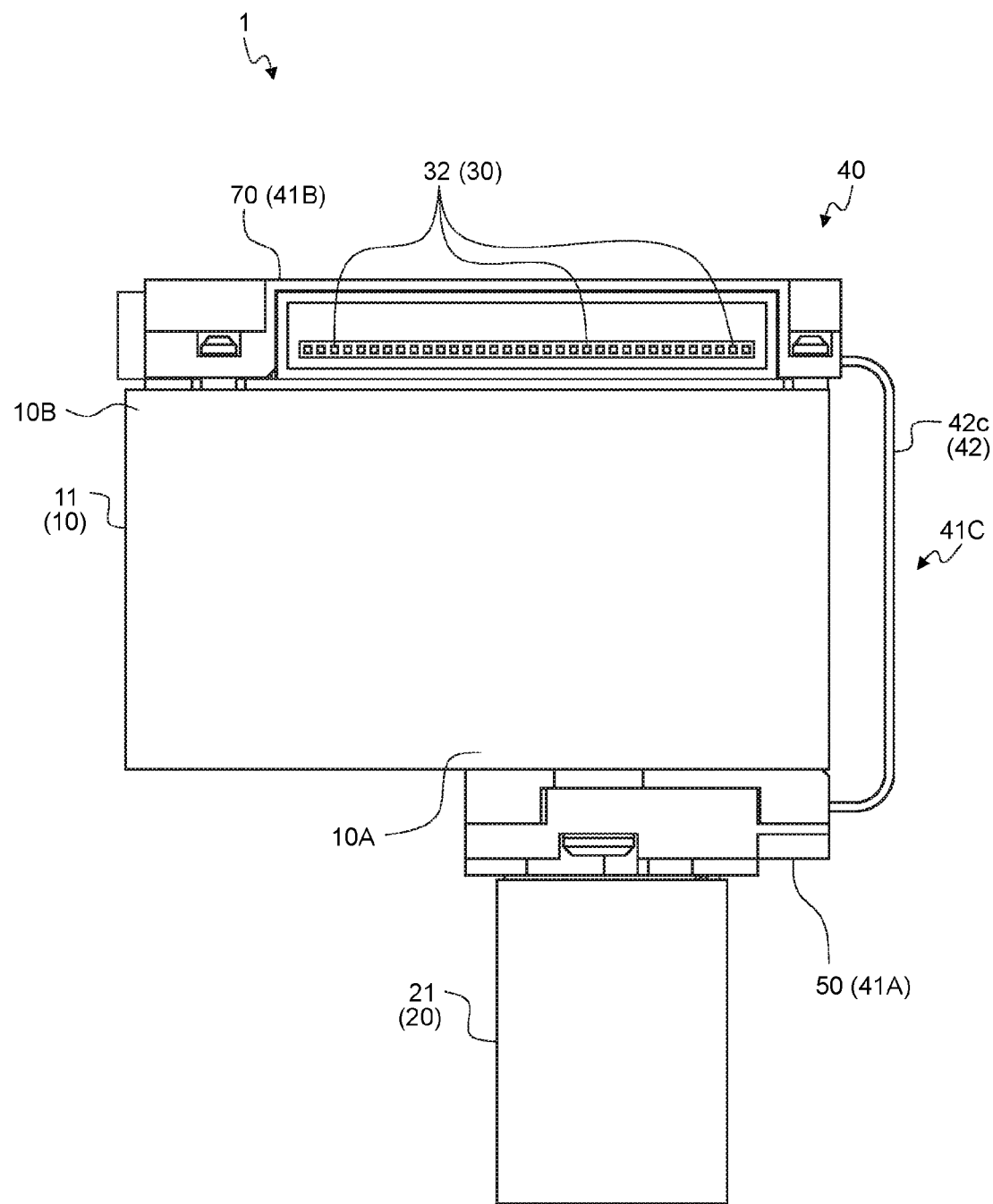
FIG. 22 is a view illustrating another application example of the connector module for the oil pressure circuit body (hydraulic pressure circuit body).

For another example, in an oil pressure circuit body 10 illustrated in FIG. 22, the principal portion 11 is formed into a rectangular parallelepiped shape, and the mounting surface of the control system arrangement portion 10B is arranged on the rear side of the mounting surface of the drive system arrangement portion 10A. Also in this case, the connector module 40 can be mounted to such an oil pressure circuit body 10 by setting the path length of the coupling portion 42c of the electrical wire 42 so that the coupling portion 42c may connect the first electrical connection structure 41A and the second electrical connection structure 41B mounted on the respective mounting surfaces.

Although not illustrated, the mounting surface of the drive system arrangement portion 10A in the oil pressure circuit body 10 may be formed by a combination of a plurality of flat surfaces. In this oil pressure circuit body 10, the electromagnetic valves 20 are inserted through the respective flat surfaces. For example, one mounting surface for the drive system arrangement portion 10A is provided with a step to the mounting surface for the control system arrangement portion 10B. Another mounting surface for the drive system arrangement portion 10A is provided with an angle to the mounting surface for the control system arrangement portion 10B. In the connector module 40 according to the present embodiment, the first electrical connection structure 41A is provided for each mounting surface for the drive system arrangement portion 10A, and the first electrical connection structures 41A are connected to the second electrical connection structure 41B by the corresponding electrical wires 42. The path length of the coupling portion 42c is optimized for the electrical wire 42 in each first electrical connection structure 41A, and hence the connector module 40 can be mounted to such an oil pressure circuit body 10.

In the connector modules 40 described above, the coupling member 81 may be provided to the movable portion 41C, but the coupling member 81 does not need to be provided to the movable portion 41C unless the durability of the coupling portion 42c is decreased.

In the connector module 40 in the present embodiment, the first electrical connection structure 41A and the second electrical connection structure 41B can be displaced between the first state (FIG. 17) in which the first electrical connection structure 41A and the second electrical connection structure 41B has a relative positional relation with the movable portion 41C as the boundary such that the first electrical connection structure 41A and the second electrical connection structure 41B are substantially flush with each other and the second state (FIG. 18 to FIG. 22) obtained by changing the relative positional relation with the movable portion 41C as the boundary from the first state. When the connector module 40 is conveyed, the connector module 40 is stored in a packing material such as a packing box in the first state where the first electrical connection structure 41A and the second electrical connection structure 41B are substantially flush with each other, and hence a larger number of the connector modules 40 can be stored in a packing material as compared with the second state. Consequently, a larger number of the connector modules 40 can be conveyed at a time, and the cost can be reduced from this point as well.

The connector module according to the embodiments is configured to electrically connect an electrical wire wired on a wiring plate to a counterpart electrical connection portion, and a connection part of the electrical wire and the counterpart electrical connection portion is covered with an insulating member while being housed in a recess-shaped portion. The connector module can thus reduce the cost while obtaining satisfactory productivity and durability. The hydraulic pressure control device according to the embodiments includes such a connector module, and can thus obtain the same effects as those exhibited by the connector module.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A connector module comprising:
   an electrical connection structure including a plurality of electrical wires and a wiring plate on which the electrical wires are wired, wherein
   each of the electrical wires is coated with an insulating coating, and includes
      a wiring portion wired on the wiring plate, and
      an electrical connection portion to be physically and electrically connected to a counterpart electrical connection portion,
   the wiring plate includes a surrounded recess-shaped portion,
   the electrical connection portion and the counterpart electrical connection portion are arranged in the recess-shaped portion and formed such that a physical and electrical connection part thereof is housed in the recess-shaped portion, and
   the connection part is covered with an insulating member.

2. The connector module according to claim 1, wherein the insulating member is formed by solidifying an insulating synthetic resin material poured into the recess-shaped portion.

3. The connector module according to claim 1, wherein when a plurality of the connection parts are housed in the recess-shaped portion, an insulating synthetic resin material is poured into the recess-shaped portion and solidified under a state in which the connection parts are housed while being separated from one another with gaps, to form the insulating member configured to cover each of the connection parts.

4. The connector module according to claim 2, wherein when a plurality of the connection parts are housed in the recess-shaped portion, an insulating synthetic resin material is poured into the recess-shaped portion and solidified under a state in which the connection parts are housed while being separated from one another with gaps, to form the insulating member configured to cover each of the connection parts.

5. The connector module according to claim 1, wherein
the recess-shaped portion is formed by being recessed from a wiring surface of the wiring plate on which the wiring portion is wired, and
the electrical connection portion is offset from the wiring portion so as to be arranged in the recess-shaped portion.

6. The connector module according to claim 2, wherein
the recess-shaped portion is formed by being recessed from a wiring surface of the wiring plate on which the wiring portion is wired, and
the electrical connection portion is offset from the wiring portion so as to be arranged in the recess-shaped portion.

7. The connector module according to claim 3, wherein
the recess-shaped portion is formed by being recessed from a wiring surface of the wiring plate on which the wiring portion is wired, and
the electrical connection portion is offset from the wiring portion so as to be arranged in the recess-shaped portion.

8. The connector module according to any one of claim 1, wherein
the electrical connection structures are arranged adjacent to each other,
in each of the electrical connection structures arranged adjacent to each other, the electrical connection portion of the electrical wire on one end side is physically and electrically connected to the counterpart electrical connection portion of a corresponding electrical connection target, and a part of the electrical wire in one of the electrical connection structures closer to another end than the wiring portion and a part of the electrical wire in another of the electrical connection structure closer to another end than the wiring portion have an electrical connection relation, and
a movable portion capable of changing a relative positional relation between the electrical connection structures arranged adjacent to each other is provided between the electrical connection structures.

9. The connector module according to any one of claim 2, wherein
the electrical connection structures are arranged adjacent to each other,
in each of the electrical connection structures arranged adjacent to each other, the electrical connection portion of the electrical wire on one end side is physically and electrically connected to the counterpart electrical connection portion of a corresponding electrical connection target, and a part of the electrical wire in one of the electrical connection structures closer to another end than the wiring portion and a part of the electrical wire in another of the electrical connection structure closer to another end than the wiring portion have an electrical connection relation, and
a movable portion capable of changing a relative positional relation between the electrical connection structures arranged adjacent to each other is provided between the electrical connection structures.

10. The connector module according to any one of claim 3, wherein
the electrical connection structures are arranged adjacent to each other,
in each of the electrical connection structures arranged adjacent to each other, the electrical connection portion of the electrical wire on one end side is physically and electrically connected to the counterpart electrical connection portion of a corresponding electrical connection target, and a part of the electrical wire in one of the electrical connection structures closer to another end than the wiring portion and a part of the electrical wire in another of the electrical connection structure closer to another end than the wiring portion have an electrical connection relation, and
a movable portion capable of changing a relative positional relation between the electrical connection structures arranged adjacent to each other is provided between the electrical connection structures.

11. The connector module according to any one of claim 5, wherein
the electrical connection structures are arranged adjacent to each other,
in each of the electrical connection structures arranged adjacent to each other, the electrical connection portion of the electrical wire on one end side is physically and electrically connected to the counterpart electrical connection portion of a corresponding electrical connection target, and a part of the electrical wire in one of the electrical connection structures closer to another end than the wiring portion and a part of the electrical wire in another of the electrical connection structure closer to another end than the wiring portion have an electrical connection relation, and
a movable portion capable of changing a relative positional relation between the electrical connection structures arranged adjacent to each other is provided between the electrical connection structures.

12. A hydraulic pressure control device comprising:
a hydraulic pressure circuit body including a hydraulic pressure circuit configured to cause an operating fluid for an object to be controlled to flow;
a control unit configured to control a flow rate of the operating fluid in the hydraulic pressure circuit;
an electromagnetic valve that is connected to the hydraulic pressure circuit body and is controlled to be driven by the control unit so as to adjust the flow rate of the operating fluid in the hydraulic pressure circuit; and
an electrical connection structure including a plurality of electrical wires and a wiring plate on which the electrical wires are wired, wherein
each of the electrical wires is coated with an insulating coating, and includes
a wiring portion wired on the wiring plate, and
an electrical connection portion to be physically and electrically connected to one of counterpart electrical connection portions on the electromagnetic valve side and the control unit side,
the wiring plate includes a surrounded recess-shaped portion,
the electrical connection portion and the counterpart electrical connection portion are formed so as to be arranged in the recess-shaped portion and such that a physical and electrical connection part thereof is housed in the recess-shaped portion, and
the connection part is covered with an insulating member.

* * * * *